United States Patent [19]

Ikeno

[11] Patent Number: 4,987,477
[45] Date of Patent: Jan. 22, 1991

[54] SOLID STATE IMAGING DEVICE

[75] Inventor: Masahiko Ikeno, Itami, Japan

[73] Assignee: Mitsubishi Denki Kabushiki Kaisha, Japan

[21] Appl. No.: 430,419

[22] Filed: Nov. 2, 1989

[30] Foreign Application Priority Data

Jul. 10, 1989 [JP] Japan .................................. 1-175588

[51] Int. Cl.⁵ ...................... H01L 23/16; H01L 23/02; H01L 23/12; H01L 39/02
[52] U.S. Cl. ......................................... 357/75; 357/74; 357/80; 357/25
[58] Field of Search ............................ 357/75, 80, 74; 361/392, 393, 394, 399; 250/578.1, 239

[56] References Cited

U.S. PATENT DOCUMENTS 3,784,884  1/1974  Zoroglu ................................ 357/75
4,322,735  3/1982  Sadamasa et al. ..................... 357/17
4,712,018 12/1987  Stoffel et al. ......................... 250/578
4,739,389  4/1988  Goedbloed ............................ 357/75

Primary Examiner—Rolf Hille
Assistant Examiner—D. M. Ostrowski
Attorney, Agent, or Firm—Leydig, Voit & Mayer

[57] ABSTRACT

A solid state imaging device has solid-state imaging-device chips each having a picture-element array and bonding pads, chip carriers each having long sides longer than the solid-state imaging-device chip and terminals electrically connected to corresponding bonding pads on the chip, a package board which carries the chip carriers, and external leads provided on the package board and electrically connected to the respective terminals of the chip carriers. In a method of assembling such a solid state imaging device, a plurality of solid-state imaging-device chips are mounted on respective chip carriers, and a plurality of imaging units are formed by electrically connecting the terminals of each chip carrier to the corresponding bonding pads. The imaging units are then arranged on the package board and the terminals of the imaging units are connected to the external leads, respectively. A test is conducted on the solid-state imaging-device chips of each imaging unit, and if a non-conforming chip is found, an imaging unit including the non-conforming chip is removed from the package board and a new imaging unit is secured to the package board in place of the removed chip.

20 Claims, 22 Drawing Sheets

FIG. IIA
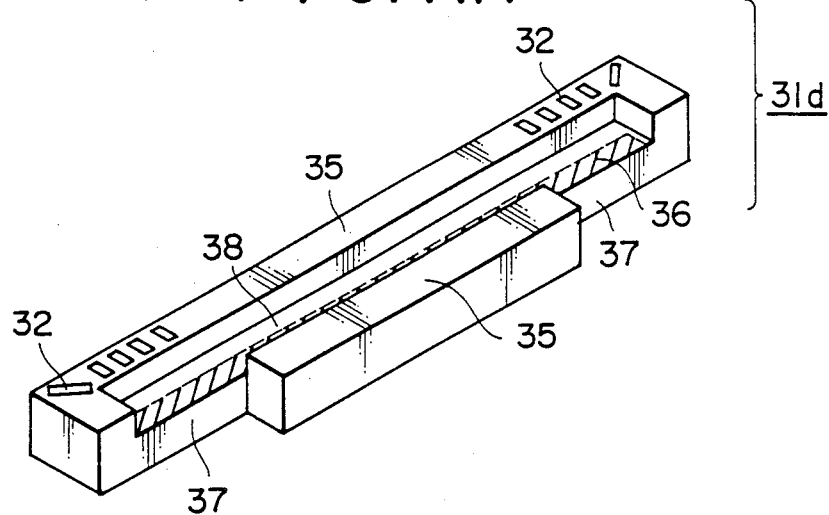
FIG. IIB
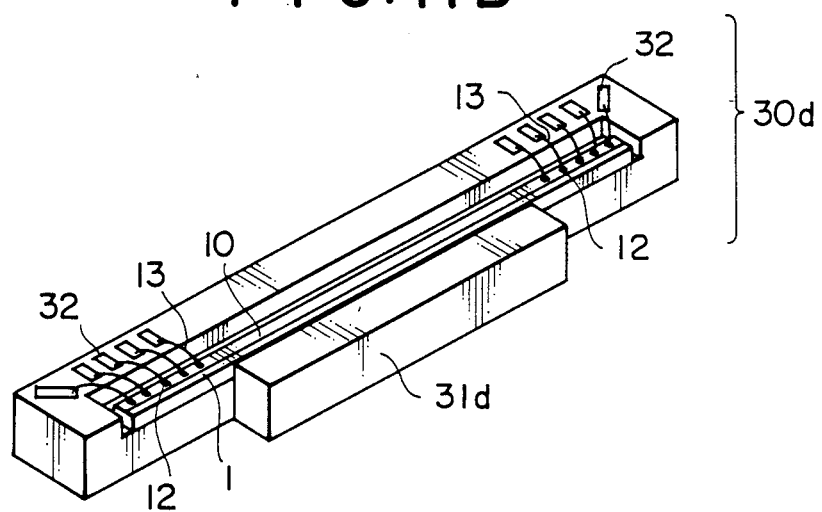

F I G. 19A
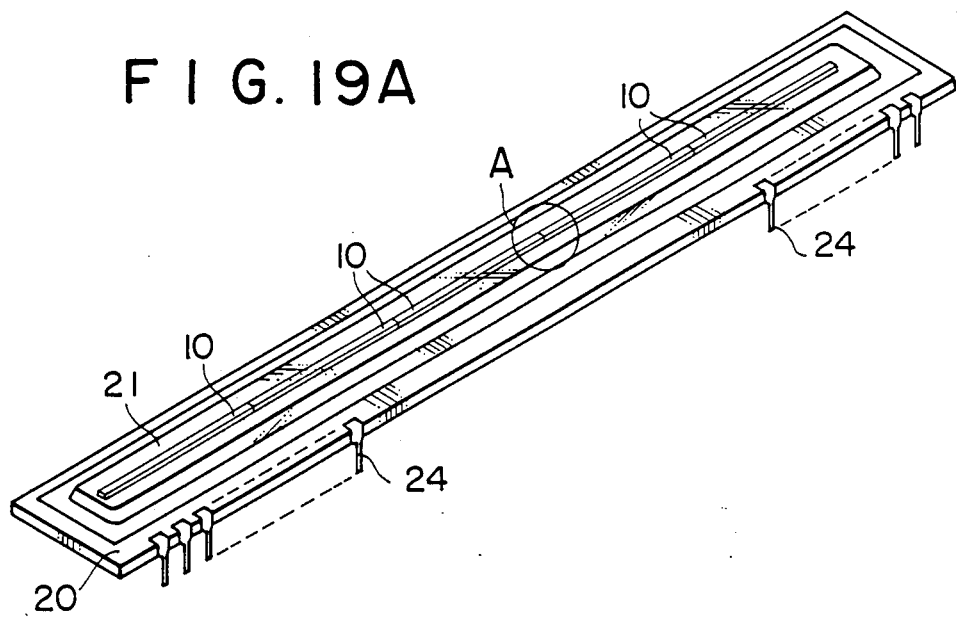
F I G. 19B
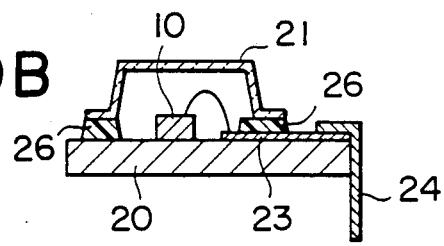
F I G. 19C
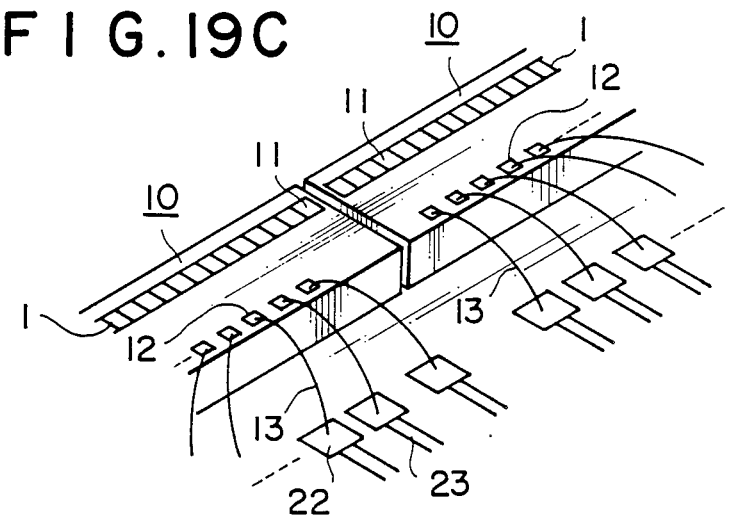

SOLID STATE IMAGING DEVICE

BACKGROUND OF THE INVENTION

1. Field of the Invention

This invention relates to a solid state imaging device including a plurality of solid-state imaging-device chips and which is suitable for use in an image input apparatus or the like. This invention also relates to a method for assembling such a solid state imaging device.

2. Description of the Related Art

A conventional solid state imaging device in which a plurality of solid-state imaging-device chips are arranged in a common plane has a structure, for example, like that shown in FIG. 19A. The solid state imaging device shown in FIG. 19A is an in-line arrangement type of solid state imaging device in which a plurality of rectangular solid-state imaging-device chips 10, which are called CCD (charge coupled device) linear image sensors, are arranged in a straight line. FIG. 19B is a cross-sectional view of this solid state imaging device. As shown in FIGS. 19A and 19B, the plurality of solid-state imaging-device chips 10 are secured to a package board 20 by die bond resin (not shown). Wiring portions 23 are formed on the package board 20, and external leads 24 connected to the corresponding wiring portions 23 are fixed at an outer edge of the package board 20. A glass lid 21 is mounted on the package board 20 by adhesive resin 26, defining a space for hermetically enclosing the portion on which the solid-state imaging-device chips 10 are carried.

As shown in FIG. 19C, bonding pads 12 are formed on each of the solid-state imaging-device chips 10, and these bonding pads 12 are electrically connected by wires 13 to corresponding terminals 22 connected to the respective wiring portions 23. Picture elements 11, such as photodiodes, a light receiving portion, are disposed on the upper surface (as viewed in the figure) of the solid-state imaging-device chip 10, and this plurality of picture elements 11 is arranged in series to as a picture-element array 1.

The solid state imaging device having the above-described construction is primarily used as an image input device for scanning a document for readout of information in a facsimile, a copying machine or the like. For instance, in order to scan an A3-size document for readout of information, it has been necessary to assemble a solid state imaging device having an effective readout width of at least 290 mm. However, the maximum length of the solid-state imaging-device chip 10 such as a CCD linear image sensor, which utilizes silicon semiconductor technology or the like, is limited by the diameter of a silicon substrate which is employed in forming this image sensor. Even if a silicon substrate of, for example, a 6 inch size is employed, the obtained sensor length is actually on the order of 100 mm since the number of chips to be cut from one wafer needs to be made large to some extent. Accordingly, in order to assure the effective readout width mentioned above, the plurality of solid-state imaging-device chips 10 are arranged as shown in FIG. 19C so that the picture-element arrays 1 are arranged in a straight line.

A method for producing a solid state imaging device comprising the aforesaid plurality of solid-state imaging-device chips 10 is explained with reference to the flow chart shown in FIG. 20.

First of all, in Step S1, a plurality of solid-state imaging-device chips 10 which are formed on a silicon substrate using silicon processing techniques are electrically measured and checked in terms of characteristics, operating performance and the like (wafer test). On the basis of the result of this wafer test, non-conforming chips are discriminated from conforming chips.

Subsequently, in Step S2, this silicon substrate is divided into individual chips by dicing. Of the solid-state imaging-device chips 10 thus divided, only the required number of chips which have been accepted as conforming articles in the wafer test of Step S1, for example, five chips are extracted. Then, in Step S3, these five chips are sequentially positioned on the package board 20 shown in FIG. 19A, and adhesively fixed thereto with die bond resin. Then, in Step S4, the bonding pads of each of the chips 10 are wire-bonded to the corresponding terminals 22 on the package board 20 by the wires 13.

Subsequently, in Step S5, the glass lid 21 is adhesively fixed to the package board 20 using the adhesive resin 26 in order to protect the solid-state imaging-device chips 10.

Through the steps described above, the solid state imaging device in which the five solid-state imaging-device chips 10 are arranged along a line is assembled. In order to check whether failure has occurred in each chip 10 during the assembling steps, after all the assembling steps have been completed, the characteristics of each chip 10 are again measured and evaluated (final test) in Step S6. This final test may be conducted in Step S7 of FIG. 20 immediately before Step S5, which is a glass-lid bonding step.

The foregoing is an explanation of an in-line arrangement type of solid state imaging device in which the plurality of solid-state imaging-device chips 10 are arranged in a straight line. Another known type of solid state imaging device uses a staggered arrangement of solid state imaging devices, such as shown in FIGS. 21A to 21C. In this solid state imaging device, the plurality of solid-state imaging-device chips 10 are arranged on the package board 20 in such a manner that each of the chips 10 alternately overlaps the adjacent chip 10 to a slight extent. Accordingly, no gap in the scan direction is present even at the junctions between the adjacent chips 10, and it is therefore possible to enjoy the advantage that image data can be read without omission. However, because of the overlapped arrangement, a circuit for correcting time and space in the scan direction is needed.

The basic structure of the above-described conventional staggered arrangement type of solid state imaging device is substantially the same as that of the in-line arrangement type of solid state imaging device, and the assembling method is also basically identical to the method shown in the flow of FIG. 20.

As described previously, in the wafer test of Step S1, it is determined whether the solid-state imaging-device chips 10 to be used in the solid state imaging device of the type described are conforming articles or non-conforming articles. Accordingly, the conforming articles alone are collected and assembled into the solid state imaging device. In practice, however, defects or failure of electrical characteristics may take place in the chips due to foreign matter clinging to the chips or to damage caused thereto in a dicing step, a die-bonding step, or a wire-bonding step after the wafer test, or during handling of the chips in these steps. For this reason, the conventional solid state imaging device is again subjected to the test (final test) in either Step S6 after the glass-lid bonding step is carried out in Step S5 of FIG. 20 or in Step S7 after the wire-bonding step is carried out in Step S4. In this manner, in the prior art, the final decision is made as to whether the solid state imaging device is a conforming article or a non-conforming article.

Accordingly, in a case where it is found in the final test that a defect has occurred in one chip of a solid state imaging device having, for example, a five chip construction, if no action is taken, it follows that the solid state imaging device consisting of the combination of this plurality of solid-state imaging-device chips 10 is a non-conforming article. As a result, not only the non-conforming chip but the four conforming chips will be regarded as non-conforming chips. Accordingly, it has been impossible to avoid low production yield and to use conforming solid-state imaging-device chips 10 form a non-conforming device.

To overcome such problems, a method (chip replacement method) of replacing the non-conforming chip found in the final test with another conforming chip is proposed. However, since the chips 10 are commonly arranged extremely close to each other in order to minimize the gaps between the adjacent chips 10, it has been difficult to cut the connections made by the relevant wires 13 and remove the non-conforming chip alone from among the chips 10 arranged by overcoming the adhesive force of the die bond resin without causing damage to the other conforming chips. Even if the non-conforming chip alone could be removed, it would be difficult to remove the die bond remaining on the package board 20 without foreign matter such as dust clinging to the other conforming chips. In addition, it is extremely difficult to newly insert a conforming chip into the limited space and fix it there by die bonding without adversely affecting the other chips. Moreover, the process is extremely complicated due to various factors such as the necessity of a wire bonding step, and it is nearly impossible, rather than merely difficult, to complete the sequence of steps described above without inducing defects such as physical damage, adhesion of foreign matter or the like or failure of electrical characteristics in the other conforming chips.

These problems apply not only to the in-line arrangement type of solid state imaging device but to the staggered arrangement type of solid state imaging device.

The above chip replacement is not needed only in the case of replacement of a non-conforming chip with a conforming chip. For example, if electrical characteristics such as sensitivity, dark current value, saturation signal level and spectral sensitivity characteristics of each solid-state imaging-device chip are not within a proper range and certain variations in the electrical characteristics are found among the chips, it may also be necessary to replace a chip, that is to say, to replace a particular chip with another chip having the desired characteristics. However, it is still difficult to carry out such a chip replacement.

In order to improve, the reliability of handling and to enable chip testing before solid-state imaging-device chips separated from a wafer are fixed to a package board, the present applicant has disclosed another type of solid state imaging device in Japanese Published Patent Application No. 62-279671. This solid state imaging device is produced by preparing a plurality of sub-kits by carrying each solid-state imaging-device chip on a base which has long sides shorter than the chip and which has short sides longer than the chip and arranging the plurality of sub-kits on a package board. The arrangement of this solid state imaging device allows chip replacement after assembly, but since the length of the chip is greater than that of the base, the end faces of adjacent chips may be damaged by contact with each other during positioning of the sub-kits.

SUMMARY OF THE INVENTION

It is, therefore, an object of the present invention to provide a solid state imaging device which allows an arbitrary solid-state imaging-device chip to be readily replaced even after assembly without causing damage to nearby chips.

It is another object of the present invention to provide a method for assembling a solid state imaging device which enables a conforming solid-state imaging-device chip to be used effectively and which can improve the production yield to a great extent.

In accordance with one aspect of the present invention, there is provided a solid state imaging device which comprises a plurality of solid-state imaging-device chips each having a picture-element array and a plurality of bonding pads, a plurality of chip carriers on which corresponding solid-state imaging-device chips are carried, each of which has long sides longer than the solid-state imaging-device chip carried thereon and a plurality of terminals electrically connected to the respective bonding pads on the carried solid-state imaging-device chip, a package board which carries the plurality of chip carriers, and external leads on the package board electrically connected to the corresponding terminals of the plurality of chip carriers.

In accordance with another aspect of the present invention, there is provided a method of assembling a solid state imaging device which comprises the steps of preparing a plurality of solid-state imaging-device chips each having a picture-element array and a plurality of bonding pads, preparing a plurality of chip carriers each having a plurality of terminals and long sides longer than each of the solid-state imaging-device chips, preparing a package board having a plurality of external leads, carrying the plurality of solid-state imaging-device chips on the plurality of chip carriers, respectively, forming a plurality of imaging units by electrically connecting the plurality of terminals of each of the chip carriers to the plurality of bonding pads of the solid-state imaging-device chip carried thereon, respectively, arranging and securing the plurality of imaging units on the package board, electrically connecting the terminals of the plurality of imaging units to the external leads, respectively, conducting a test on the solid-state imaging-device chips of each of the imaging units, and removing an imaging unit including a non-conforming solid-state imaging-device chip from the package board and securing a new imaging unit on the package board in place of the removed solid-state imaging-device chip in a case where the non-conforming solid-state imaging-device chip is found in the test.

BRIEF DESCRIPTION OF THE DRAWINGS

FIG. 11A is a diagrammatic perspective view showing the chip carrier used in a fifth embodiment;

FIG. 11B is a diagrammatic perspective view showing an imaging unit employing the chip carrier of FIG. 11A;

FIGS. 19A and 19B are respectively a perspective view and a cross-sectional view which diagrammatically show a conventional type of solid state imaging device;

FIG. 19C is an enlarged view of a portion A of FIG. 19A;

DESCRIPTION OF THE PREFERRED EMBODIMENTS

Embodiments of this invention will be described below with reference to the accompanying drawings.

Figure 1A:
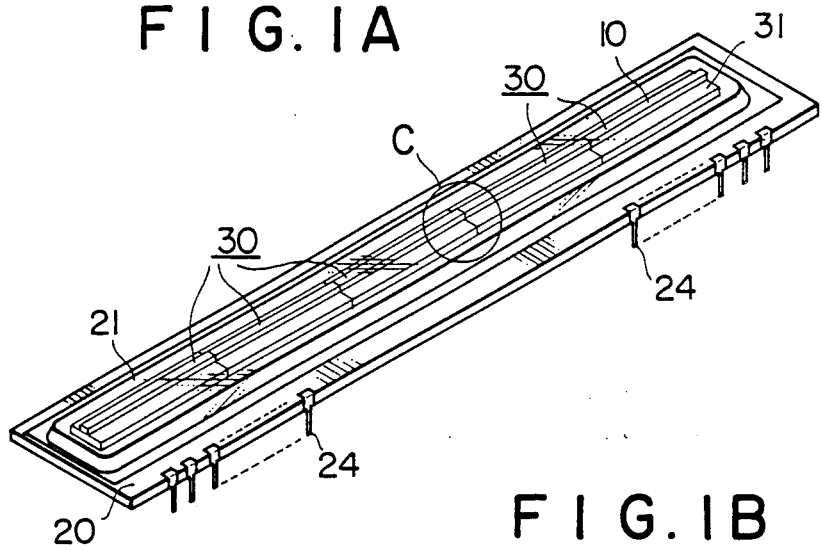
FIGS. 1A and 1B are respectively a perspective view and a cross-sectional view which diagrammatically show a solid state imaging device according to a first embodiment of this invention.
Figure 1B:
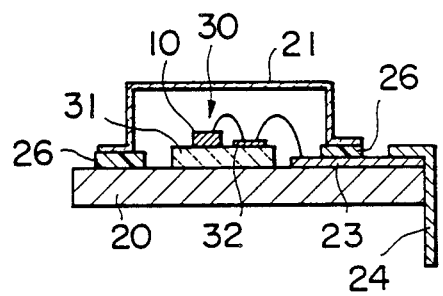

As shown in FIG. 1A, a solid state imaging device according to a first embodiment is an in-line type of solid state imaging device in which five solid-state imaging-device chips, each of which is a CCD linear image sensor of 65 mm length, for example, are arranged in series and which has a A3-size readout width. FIG. 1B is a cross-sectional view of this Solid-state imaging device. In FIGS. 1A and 1B, a plurality of solid-state imaging-device chips 10 are secured by die bond resin (not shown) to respective chip carriers 31 made of a ceramic or the like, and a plurality of imaging units 30 are thus formed. The chip carriers 31 of the respective imaging units 30 are secured to a package board 20 by an adhesive (not shown). Wiring portions 23 are formed on the package board 20, and external leads 24 connected to the respective wiring portions 23 are fixed along an outer edge of the package board 20. In order to define a space for hermetically enclosing the portion on which the solid-state imaging-device chips 10 are carried, a glass lid 21 is secured to the package board 20 by adhesive resin 26.

Figure 1C:
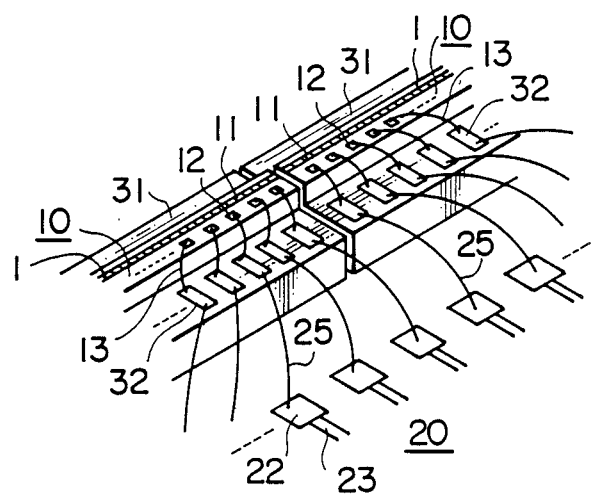
FIG. 1C is an enlarged view of a portion C of FIG. 1A.

As shown in FIG. 1C, a plurality of bonding pads 12 are disposed on each of the solid-state imaging-device chips 10, while a plurality of terminals 32 are disposed on each of the chip carriers 31. These bonding pads 12 and the corresponding terminals 32 are electrically connected to each other by wires 13. On the package board 20, terminals 22 are connected to the respective wiring portions 23, and these terminals 22 are electrically connected to the corresponding terminals 32 on the chip carrier 31 by wires 25. Further, picture elements 11, each of which is made from a photodiode and is a light receiving section, are formed on the upper surface (as viewed in the figure) of each of the solid-state imaging-device chips 10. The picture elements 11 are arranged in series as a picture-element array 1.

An important feature of the solid state imaging device having the construction described above is that the solid-state imaging-device chips 10 are carried on the package board 20 via the respective chip carriers 31. A method for assembling the solid state imaging device according to this embodiment is explained below with reference to the process diagram shown in FIGS. 2A to 2F.

Figure 2A:
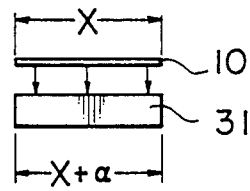
FIGS. 2A to 2F are diagrammatic views which illustrate the process steps of producing the solid state imaging device according to the first embodiment.
Figure 3A:
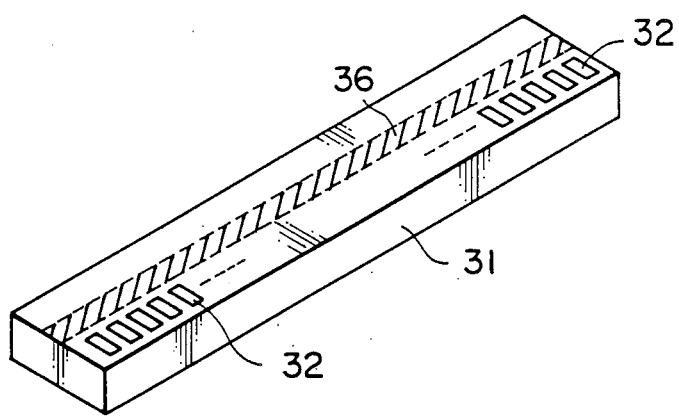
FIG. 3A is a diagrammatic perspective view of the chip carrier used in the first embodiment.

The lengths of each solid-state imaging-device chip 10 and of each chip carrier 31 are adjusted in advance so that, if the length of the solid-state imaging-device chip 10 is X mm, the length of each long side of the chip carrier 31 is (X+α) mm, where α is the amount of oversize with α≧0 mm. The reverse surface of the solid-state imaging-device chip 10 is coated with die bond resin (not shown) and, as shown in FIG. 2A, the solid-state imaging-device chip 10 is positioned so that it is not offset from the corresponding surface of the chip carrier 31, and is then die-bonded to the chip carrier 31. On one surface of the chip carrier 31, the plurality of terminals 32 are formed, as shown in FIG. 3A, along one side of a portion 36 on which the solid-state imaging-device chip 10 is to be carried.

When the die bond resin is hardened by curing, the solid-state imaging-device chip 10 is integrally secured to the chip carrier 31. It is, therefore, unnecessary to directly handle the solid-state imaging-device chip 10 in the subsequent process, and the chip carrier 31 has only to be handled. Accordingly, the solid-state imaging-device chip 10 is not directly touched with various equipment or jigs which may be used in the steps of producing the solid state imaging device after the die bonding step. It is therefore, possible to prevent the occurrence of failures, such as chipping in which corners of the solid-state imaging-device chip 10 made of a hard and brittle material are chipped during handling, and it is also possible to prevent the occurrence of contamination or the like due to dust or foreign matter which may be derived from tools such as handling jigs.

Figure 2B:
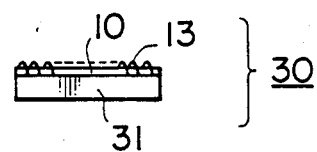
Figure 3B:
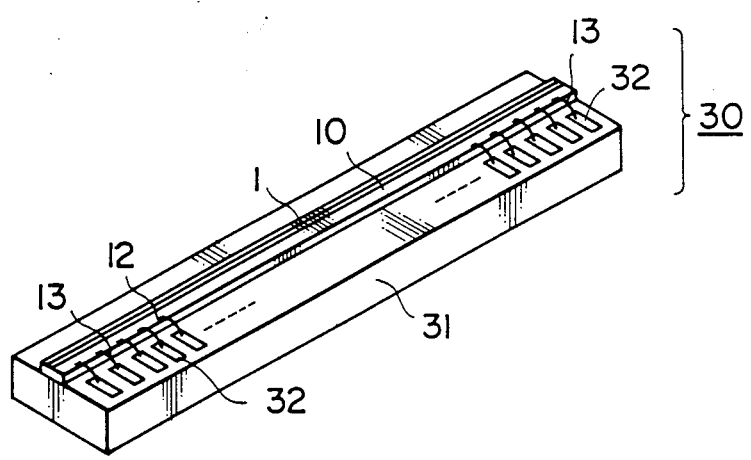
FIG. 3B is a diagrammatic perspective view of an imaging unit employing the chip carrier of FIG. 3A.

Then, as shown in FIG. 2B, the bonding pads 12 on the solid-state imaging-device chip 10 are wire-bonded to the corresponding terminals 32 of the chip carrier 31 by means of the respective wires 13 made of, for example, gold, copper or aluminum. In this manner, the electrical wiring of the solid-state imaging-device chip 10 is connected to the chip carrier 31, thereby forming the imaging unit 30. FIG. 3B is a perspective view of this imaging unit 30.

Figure 2C:
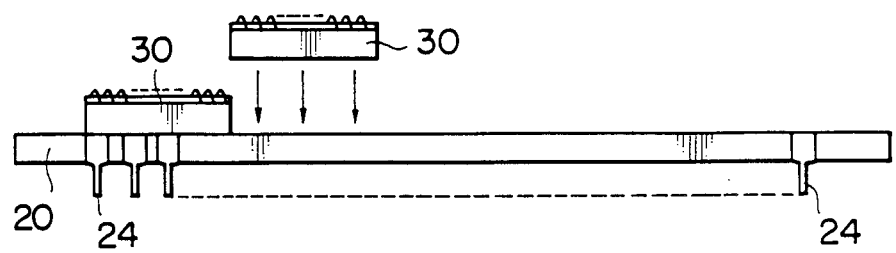
Figure 2D:
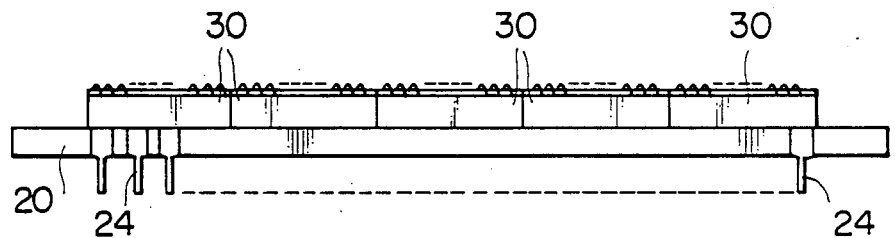

Then, as shown in FIGS. 2C to 2D, each of the imaging units 30 is sequentially positioned on the package board 20 in an in-line manner so that the picture-element arrays 1 are arranged in a straight line, each of the imaging units 30 being secured in position by an adhesive (not shown). In this step, the solid-state imaging-device chips 10 of the adjacent imaging units 30 are not brought into direct contact with each other since each of the units 30 is arranged such that the chip carrier 31 is longer than the solid-state imaging-device chip 10 by α mm which corresponds to the oversize. Accordingly, an edge of the solid-state imaging-device chip 10 is prevented from suffering physical damage such as chipping. In consequence, it is possible to position and secure the chip carriers 31 of the respective imaging units 30 on the package board 20 while directly pressing each chip carrier 31 against the adjacent chip carrier 31 to reduce the gaps between the adjacent imaging units 30. The efficiency of operation is therefore improved.

Figure 2E:
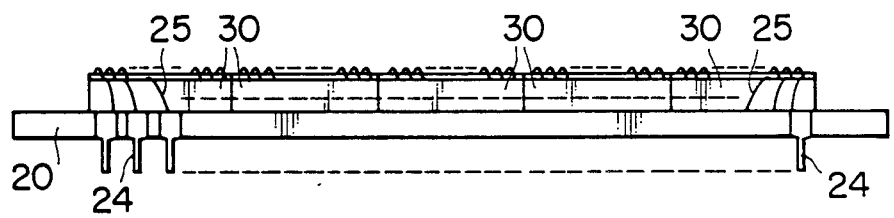
Figure 4:
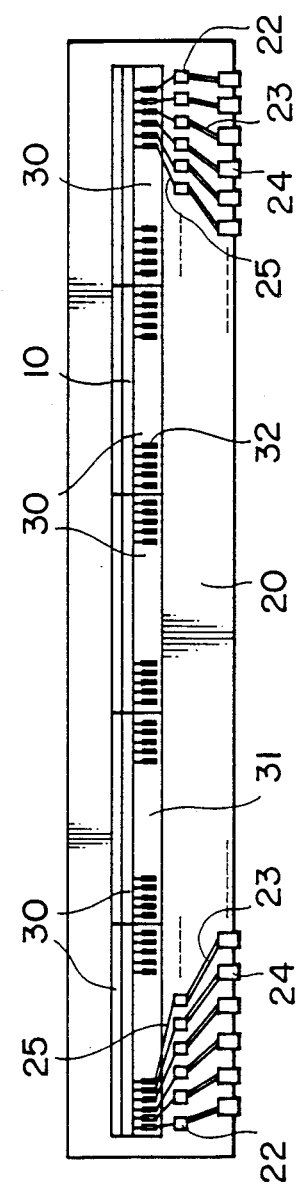
FIG. 4 is a diagrammatic plan view showing the imaging units of FIG. 3B arranged on a package board.

Then, as shown in FIG. 2E, the terminals 32 on the chip carrier 31 are wire-bonded to the corresponding terminals 22 on the package board 20 by means of respective wires 25 made of, for example, gold, copper or aluminum. In this manner, the bonding pads 12 on each of the solid-state imaging-device chips 10 are electrically connected to the corresponding external leads 24 of the package board 20. The manner in which the imaging units 30 are arranged in this step is shown in FIG. 4 in schematic plan view.

Figure 2F:
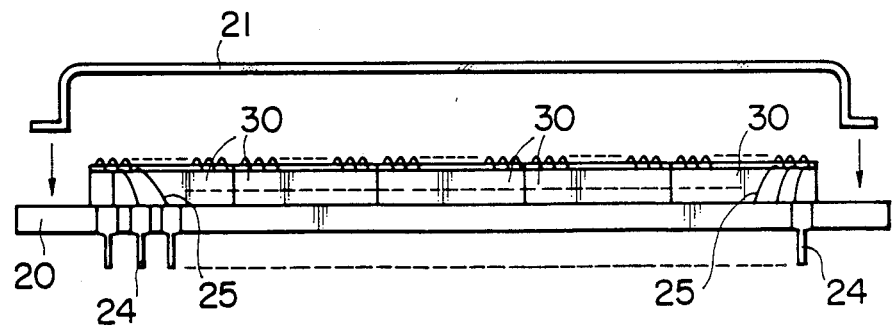

Finally, as shown in FIG. 2F, the glass lid 21 is secured to the package board 20 by an adhesive (not shown) in an atmosphere of inert gas such as nitrogen so that the portion on which the solid-state imaging-device chips 10 are carried is hermetically enclosed.

By the method described above, the solid-stage imaging device shown in FIG. 1A is basically completed. An effective method for making the quality and the performance of the solid state imaging device thus completed reliable is the insertion of the final testing step into the above-described sequence of steps.

Figure 5:
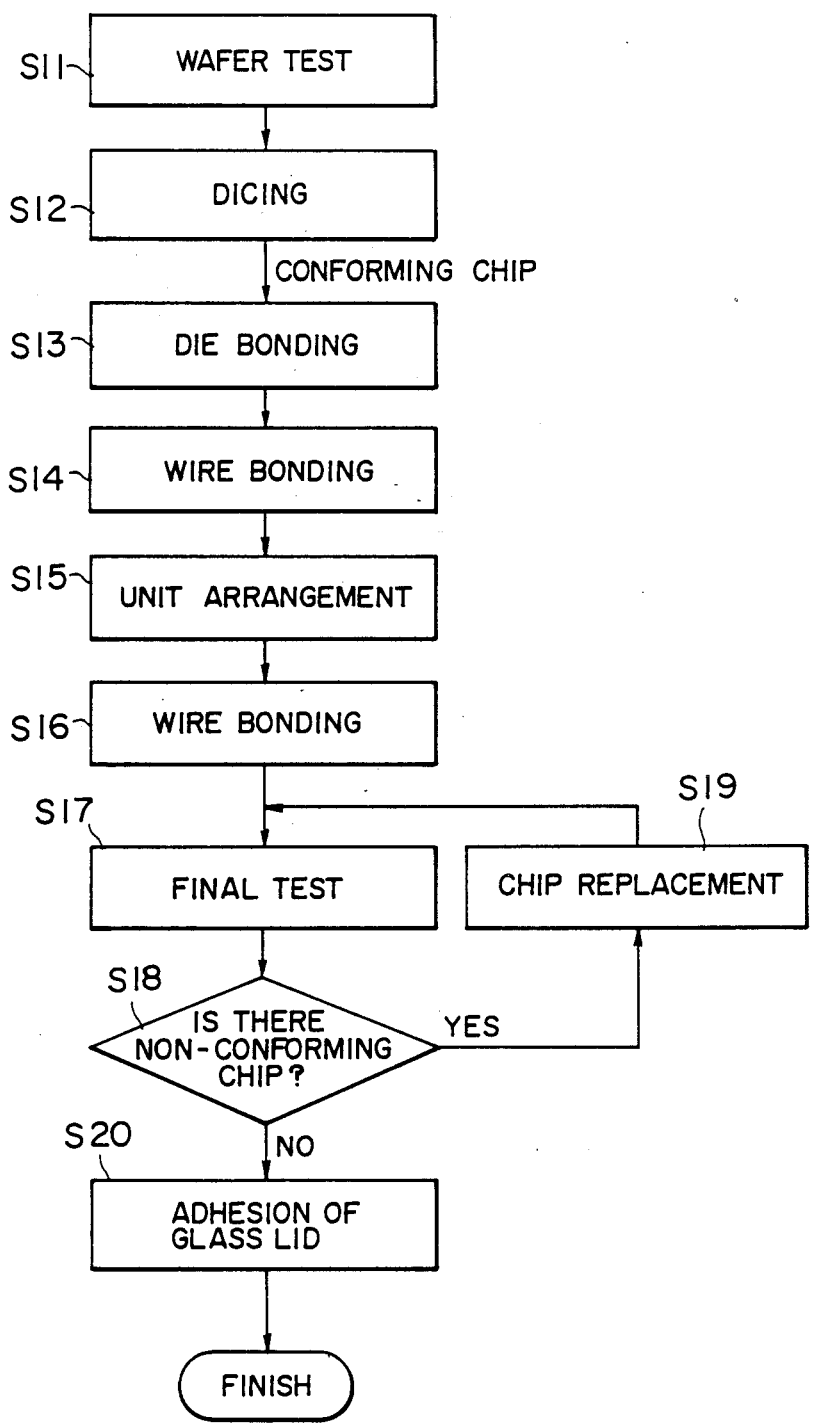
FIG. 5 is a flow chart showing a method for assembling a solid state imaging device according to this invention.

FIG. 5 is a flow chart which shows another method for assembling a solid state imaging device, the final testing step being inserted in this method. The basic flow shown in FIG. 5 corresponds to the sequence of the steps shown in FIGS. 2A to 2F, but the following explanation of the assembling method is given with reference to FIG. 5.

First, after a plurality of solid-state imaging-device chips 10 have been formed on a silicon substrate, the characteristics and the operating performance of these chips 10 are electrically measured in Step S11 (wafer test). This wafer test provides the data required to discriminate between conforming chips and non-conforming chips. Subsequently, in Step S12, the silicon substrate is diced with a dicer (not shown) and is divided into individual chips. Of the solid-state imaging-device chips 10 thus separated, conforming articles are selected on the basis of the obtained wafer-test data, and each of them is then adhesively secured to the chip carrier 31 by die bond resin in Step S13. Then, in Step S14, the bonding pads 12 of the solid-state imaging-device chip 10 are wire-bonded to the corresponding terminals 32 of the chip carrier 31, thereby forming the imaging unit 30 which includes the solid-state imaging-device chip 10 and the chip carrier 31. Then, in Step S15, the five imaging units 30 which are included in one embodiment of a solid state imageing device are sequentially secured to the package board 20 from end to end in an in-line manner with an adhesive. The adhesive usable in this step is of a thermosetting type, and is half cured at a relatively low temperature in this step. Subsequently, in Step S16, the terminals 32 on each of the chip carriers 31 are electrically connected to the corresponding terminals 22 on the package board 20 by wire bonding.

In this step, the final test, that is, a test of the electrical operation of the solid state imaging device is possible.

For this reason, in Step S17, the final test is performed, and various factors such as the presence or absence of defects and the electrical characteristics of the solid-state imaging-device chips 10 are tested with all the five imaging units 30 mounted. If it is determined in Step S18 that the solid-state imaging-device chip 10 of at least one of the imaging units 30 includes a non-conforming portion, the process proceeds to Step S19, where the wires 25 of either the imaging unit 30 which includes the non-conforming solid-state imaging-device chip 10 or the wires 25 of all the five imaging units 30 are removed. Then, a particular imaging unit 30 or all the imaging units 30 are removed from the package board 20 at the portion at which the adhesive is in a half-cured state. In many cases, the adhesive remains at the portion of the package board 20 from which the imaging unit 30 in question has been removed and on the bottom surface of the chip carrier 31 of the conforming imaging unit 30 which is to be reused. In this case, the adhesive may be mechanically removed by a scraper (not shown) or may be cleaned with an organic solvent. Alternatively, these means may be used in combination. Even while removeing the remaining adhesive, since the solid-state imaging-device chips 10 are handled as the imaging units 30 which are protected by the chip carriers 31, the occurrence of failure such as physical damage is prevented.

Subsequently, the imaging unit 30 which carries a conforming chip which is to replace the old imaging unit 30 on which the non-conforming chip is carried, as well as the conforming imaging units 30, which are to be reused are sequentially positioned and fixed on the package board 20 in a manner similar to that used in Steps S15 and S16, and these imaging units 30 are then wire bonded (chip replacement).

If it is determined in the final test of Step S17 that the assembled product is acceptable as the solid state imaging device, the adhesive which secures each imaging unit 30 to the package board 20 is completely hardened. Then, in Step S20, the glass lid 21 is adhesively bonded to the package board 20 in an atmosphere of inert gas such as nitrogen. In this manner, the in-line arrangement type of solid state imaging device is completed.

As described above, in the assembling method according to the present invention, even after the solid state imaging device has been assembled, it is possible to readily replace a particular solid-state imaging-device chip 10 without inducing defects, failure or the like.

In the method for assembling a solid state imaging device which has been explained in connection with FIG. 5, after the imaging units 30 have been arranged on the package board 20 and secured thereto by wire bonding, the final test is performed to check the presence or absence of a non-conforming chip. However, since the solid-state imaging-device chip 10 can be readily handled after the imaging unit 30 has been formed, it is possible to readily bring a testing probe into contact with the terminals 32 on the chip carrier 31 even before the imaging unit 30 is arranged on the package board 20.

Figure 6:
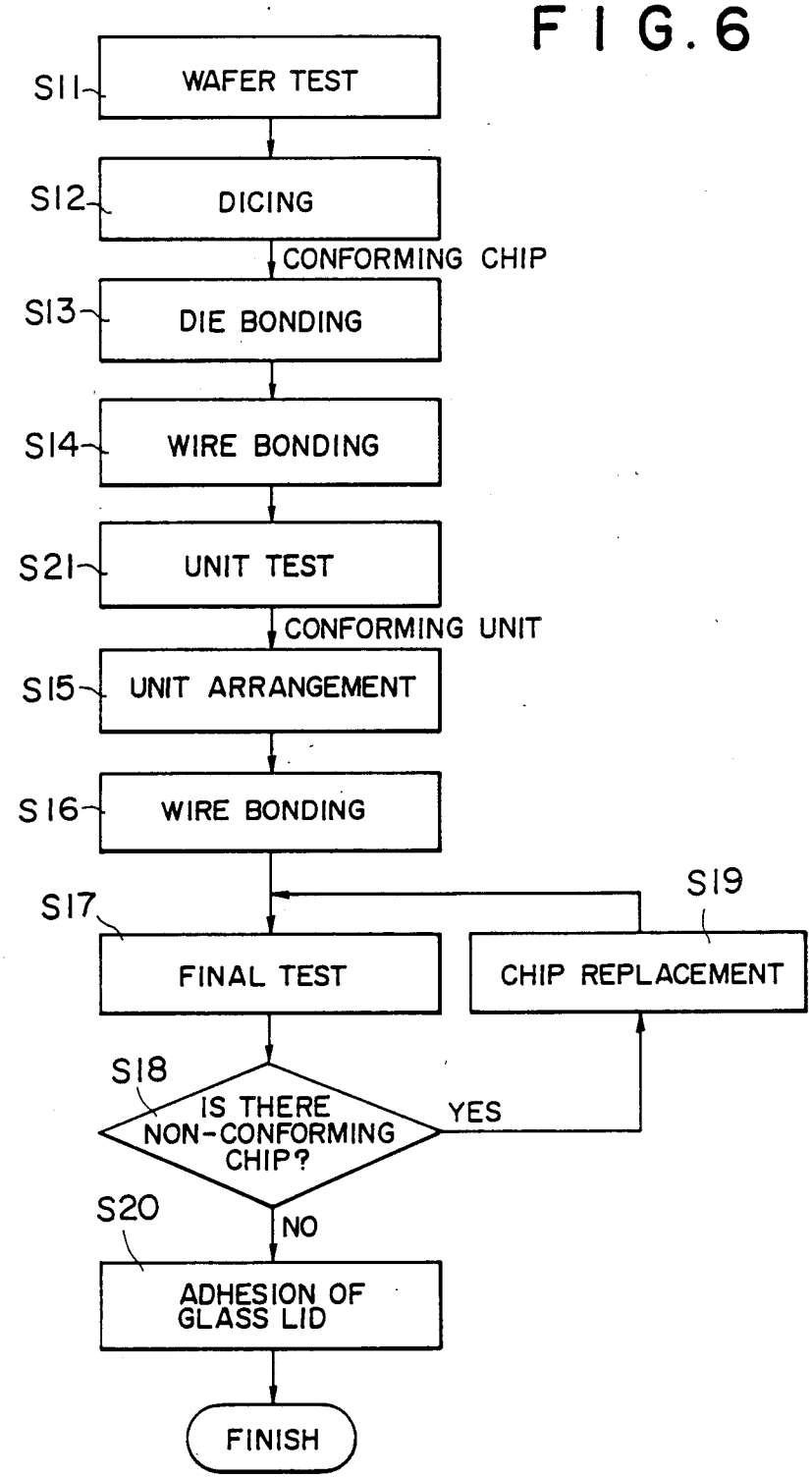
FIG. 6 is a flow chart showing an assembling method according to one modification of the invention.

As shown in FIG. 6, immediately after the imaging unit 30 has been formed in Step S14, a testing probe may be brought into contact with the terminals 32 on the chip carrier 31 in Step S21 in order to make measurement of, or a test (a unit test) on, the electrical characteristics, the presence or absence of defects or the like of the solid-state imaging-device chip 10. In this step, whether or not each imaging unit 30 is accepted is determined and, in Step S15, conforming units alone are selected and arranged on the package board 20. The following steps are similar to those of the assembling method shown in FIG. 5. However, since screening of non-conforming imaging units 30 can be Performed in the unit test shown in Step S21, it is possible to reduce the probability that chip replacement will be carried out after the imaging units 30 have been arranged on the package board 20. Accordingly, the productivity is substantially improved.

In the aforesaid embodiment, the solid-state imaging-device chip 10 is directly secured to the chip carrying area 36 of the chip carrier 31 by die bond resin. However, in order to fix the substrate potential of the solid-state imaging-device chip 10, an electrode may be formed on a part or the whole of the chip carrying area 36 and wiring may be led from the electrode and connected to any of the terminals 32.

Although reference is made to the example in which the chip carriers 31 are fixed to the package board 20 by a thermosetting adhesive, needless to say, the chip carriers 31 may be fixed by using another material or means.

In the above-described embodiment, the terminals 32 are formed on the chip carrier 31 along one side of the chip carrying area 36. However, the terminals 32 may be formed along the opposite sides of the chip carrying area 36, as required.

Although the example in which an adhesive is employed to mount the glass lid 21 is illustrated, the glass lid 21 may of course be mounted with a material or means different from the adhesive described above. Moreover, the configurations of the glass lid 21 and the package board 20 are not limited to those of the embodiment described above.

In the example illustrated in connection with the above-described embodiment, the wires 25 are employed to connect the terminals 32 on the chip carrier 31 to the corresponding terminals 22 on the package board 20, while the wires 13 are employed to connect the terminals 32 to the corresponding bonding pads 12 on the solid-state imaging-device chip 10. In either case, since the only requirement is that an electrically conducting path be formed, the connecting means is not limited to wires. As an example, it is possible to bond leads with solder.

A solid state imaging device according to a second embodiment of the invention will be explained with reference to FIGS. 7A, 7B and 8.

Figure 7A:
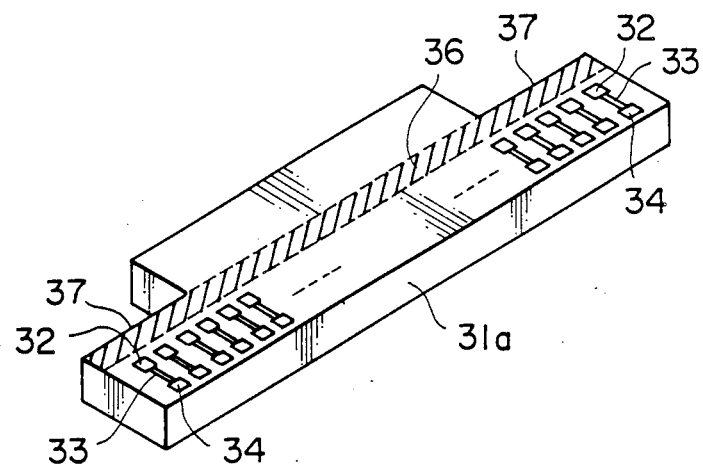
FIG. 7A is a diagrammatic perspective view showing the chip carrier used in a second embodiment.

As shown in FIG. 7A, a chip carrier 31a according to the second embodiment has a configuration in which two corners located on the same side along the longitudinal axis of the chip carrier 31a are removed. The chip carrying area 36 is formed on the upper surface (as viewed in FIG. 7A) of the chip carrier 31a in such a manner that one side of the chip carrying area 36 is disposed adjacent the removed corner cutouts 37. In addition, on the upper side of the chip carrier 31a, a plurality of terminals 32, which correspond to the respective bonding pads 12 on the solid-state imaging-device chip 10 to be carried on the chip carrying area 36, are disposed along the other side of the chip carrying area 36. These terminals 32 are electrically connected to the corresponding terminals 34 by wiring portions 33 disposed on the chip carrier 31a.

Figure 7B:
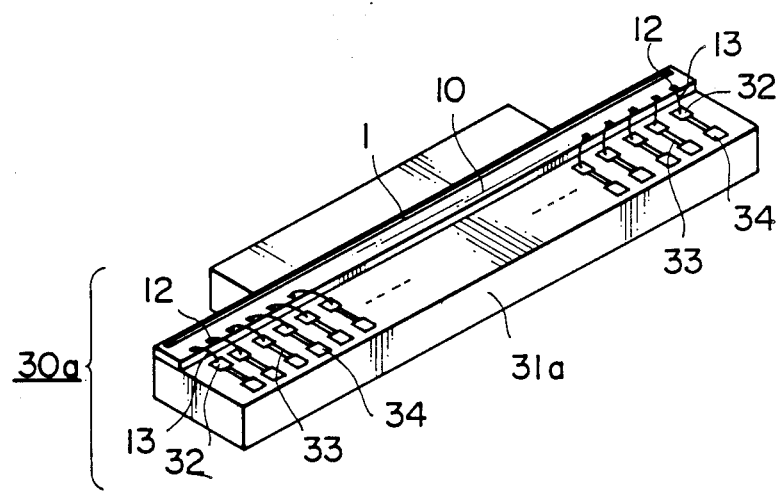
FIG. 7B is a diagrammatic perspective view showing an imaging unit employing the chip carrier of FIG. 7A.

As shown in FIG. 7B, the solid-state imaging-device chip 10 is secured to the chip carrying area 36 on the chip carrier 31a with die bond resin (not shown), and the bonding pads 12 and the corresponding terminals 32 are electrically connected to each other by the wires 13. In this manner, an imaging unit 30a is formed. In this forming step, the solid-state imaging-device chip 10 is die-bonded such that the picture-element array 1 is located close to the cutouts 37 of the chip carrier 31a. The imaging unit 30a thus formed can be handled with by gripping the side portions of the chip carrier 31a. Accordingly, it is not necessary to directly handle the solid-state imaging-device chip 10 and it is therefore possible to prevent defects.

Figure 8:
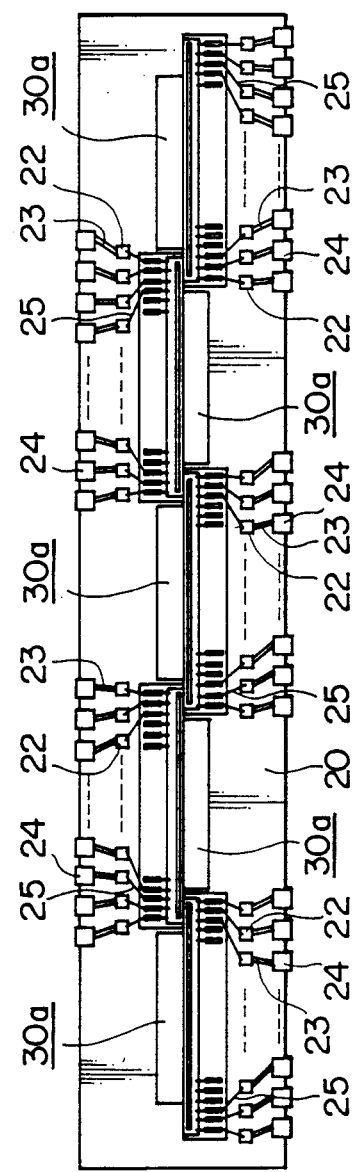
FIG. 8 is a diagrammatic plan view showing the imaging units of FIG. 7B arranged on a package board.

As shown in FIG. 8, the imaging units 30a, in this example five units, are alternately arranged such that the cutouts 37 of each imaging unit 30a overlay the cutouts 37 of the adjacent imaging units 30a. In this arrangement, the picture-element arrays 1 of the adjacent solid-state imaging-device chips 10 are located close to each other, and a staggered arrangement type of solid state imaging device is thus obtained. The terminals 34 of the chip carriers 31a are connected to the corresponding terminals 22 on the package board 20 with the wires 25 so that the bonding pads 12 and the respective external leads 24 are electrically connected to each other. The external leads 24 are divided into a plurality of groups, each group being disposed along either side edge of the package board 20 corresponding to the terminals 34 of each of the five imaging units 30a. FIG. 8 shows a state wherein a glass lid has not yet been secured.

The above second embodiment has been explained with reference to the example in which the cutouts 37 are formed at two corners of the chip carrier 31a, but the cutouts 37 may be formed at three or all of the four corners. However, since the cutouts 37 have only to be provided at the junctions of the adjacent chip carriers 31a, a chip carrier 31a having the cutout 37 at one corner only may be used as the imaging unit 30a which is located at a leading or trailing position of the array of the imaging units 30a on the package board 20. Moreover, the length of each cutout 37 is not limited to the length used in the embodiment shown in the example in FIG. 7A, and any length that can ensure an overlap between the adjacent chip carriers 31a may be selected.

The chip carriers 31a may be arranged such that the short side of each chip carrier 31a abuts against that of the adjacent chip carrier 31a. With this construction, it is also possible to provide an in-line arrangement type of solid state imaging device in which the picture-element arrays 1 are arranged in a straight line.

In various chip handling steps during the process of assembling the solid state imaging device, the chip carriers 31 or 31a may fall and land sideways or upside down by accident. Even in this case, it is desirable that the solid-state imaging-device chip 10 carried on such a chip carrier sustain no damage.

Figure 9A:
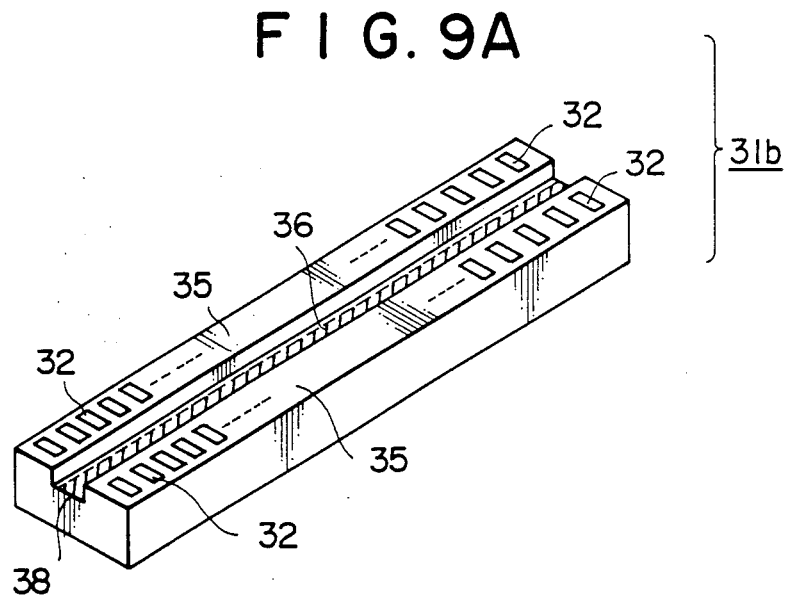
FIG. 9A is a diagrammatic perspective view showing the chip carrier used in a third embodiment.

FIG. 9A is a schematic perspective view of a chip carrier 31b for use in a solid state imaging device according to a third embodiment which meets such a demand.

Figure 9B:
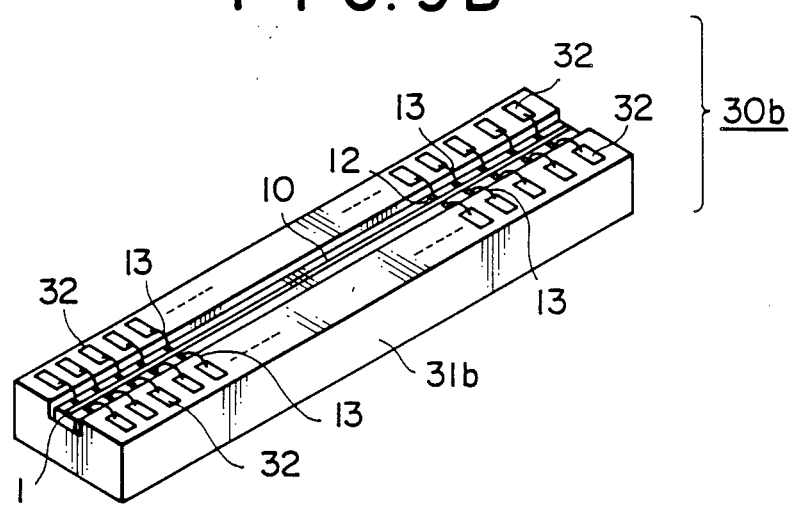
FIG. 9B is a diagrammatic perspective view showing an imaging unit employing the chip carrier of FIG. 9A.

A groove-like recess 38 is formed in the upper portion (as viewed in the figure) of the chip carrier 31b, and the groove-like recess 38 has a width which is greater than the short side of the solid-state imaging-device chip 10. The chip carrying area 36 is formed at the bottom of this groove-like recess 38. Projecting portions 35 which are positioned on the opposite sides of the groove-like recess 38 protect the solid-state imaging-device chip 10 from physical external forces, and a plurality of terminals 32 to be connected to the respective bonding pads 12 on the solid-state imaging-device chip 10 are formed on the upper side (as viewed in the figure) of each projecting portion 35. The solid-state imaging-device chip 10 is mounted, as shown in FIG. 9B, on the chip carrying area 36 of this chip carrier 31b, and the bonding pads 12 on the solid-state imaging-device chip 10 are electrically connected to the corresponding terminals 32 on the chip carrier 31b by the wires 13. In this manner, an imaging unit 30b is formed.

No projecting portion 35 for chip protection is formed at either end of the chip carrier 31b at which the solid-state imaging-device chip 10 mounted thereon abuts against the chip 10 mounted on the adjacent chip carrier 31b, that is to say, at either short side of the chip carrier 31b. Accordingly, the groove-like recess 38 has a configuration in which the opposite ends are open. Also, since the projecting portions 35 are arranged on the opposite sides of the groove-like recess 38, the thickness of the chip carrier 31b is different on its opposite sides. Accordingly, it is possible to enlarge the mechanical holding area required during assembly so that the reliability of handling of the chip carrier 31b can be improved. If the depth of the groove-like recess 38 is selected to be greater than the height (thickness) of the solid-state imaging-device chip 10, it is possible, to improve the protection of the chip 10 from damage when it falls sideways or upside down and preventing foreign matter from sticking to the chip 10. In addition, if the longitudinal size of the chip carrier 31b is equal to or greater than the length of the solid-state imaging-device chip 10 to be mounted on the chip carrier 31b, it is possible to Prevent the short-side edges of the solid-state imaging-device chip 10 from being damaged.

The above-described imaging units 30b, in this example five units, are arranged so that, as shown in FIG 1A, the short side of each imaging unit 30b abuts against the opposing short side of the adjacent imaging unit 30b, whereby an in-line arrangement type of solid state imaging device can be constructed. As is apparent here, in order to reduce the gaps between the picture-element arrays 1 on the solid-state imaging-device chips 10 of the adjacent imaging units 30b, it is desirable that the length of the chip carrier 31b and that of the solid-state imaging-device chip 10 be made as nearly equal as possible.

In the third embodiment, the groove-like recess 38 formed on the chip carrier 31b is shown as having a rectangular form in cross section and top plan. However, the form of the groove-like recess 38 is not limited to a rectangular form, and any form, such as a round form, a trapezoidal form, an irregular form or a wavy form, can be used.

Moreover, the forms of the projecting portions 35 on the opposite sides of the groove-like recess 38 are not limited particularly to rectangular forms, and the height from the bottom of the groove-like recess 38 to the tops of the projecting portions 35 need not necessarily be uniform over the length of the chip carrier 31b. For example, the projecting portions 35 may each have a stepped form or an inclined form across the length of the chip carrier 31b. Moreover, the projecting portions 35 positioned across the solid-state imaging-device chip 10 may each have a different height.

Figure 10A:
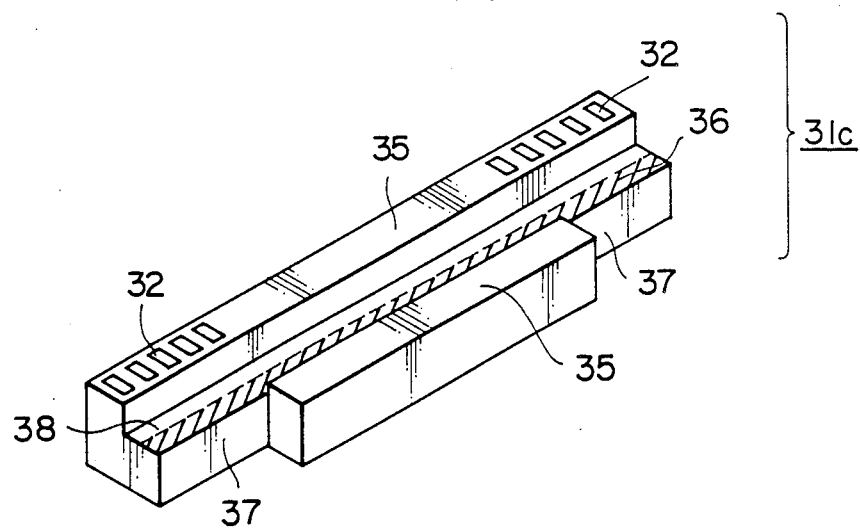
FIG. 10A is a diagrammatic perspective view showing the chip carrier used in a fourth embodiment.
Figure 10B:
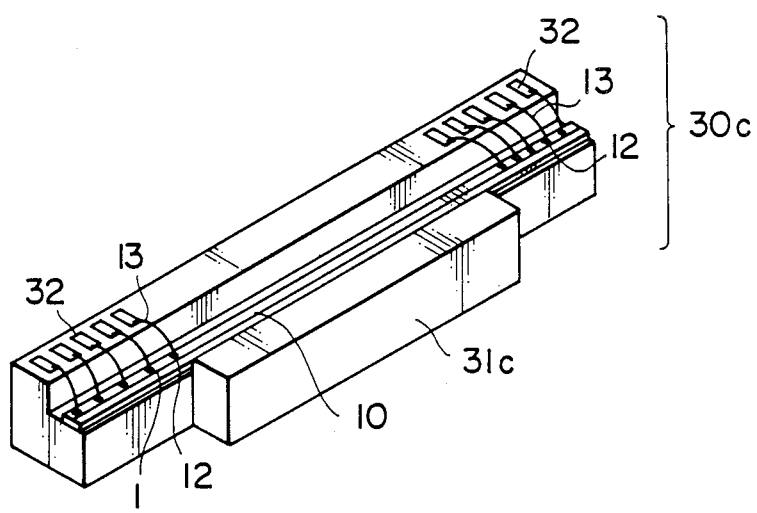
FIG. 10B is a diagrammatic perspective view showing an imaging unit employing the chip carrier of FIG. 10A.

FIG. 10A is a schematic perspective view of a chip carrier 31c for use in a solid-state imaging-device chip according to a fourth embodiment of the present invention. As in the case of the chip carrier 31b used in the third embodiment shown in FIG. 9A, the groove-like recess 38 for carrying the solid-state imaging-device chip 10 is formed in the upper portion (as viewed in the figure) of the chip carrier 31c, and the groove-like recess 38 is open at the opposite short sides. The projecting portions 35 positioned on the opposite sides of the groove-like recess 38 are removed at two of the four corners of the chip carrier 31c. As shown in FIG. 10B, the solid-state imaging-device chip 10 is mounted on the chip carrying area 36 in the groove-like recess 38, and the bonding pads 12 of the solid-state imaging-device chip 10 and the corresponding terminals 32 of the chip carrier 31c are electrically connected to each other by the wires 13, thereby forming the imaging unit 30c.

In a manner similar to that used in the second embodiment of FIG. 8, the imaging units 30c can be alternately arranged such that the cutout 37 of each imaging unit 30c overlaps the cutout 37 of the adjacent imaging unit 30c. With this arrangement, it is possible to reduce the amount of gap between the picture-element arrays 1 of the adjacent solid-state imaging-device chips 10, and the chips 10 can be readily positioned relative to each other. The terminals 32 may be formed on either or both of the projecting portions 35 of the chip carrier 31c. In FIGS. 10A and 10B, there is shown an example in which the terminals 32 are formed on the projecting portion 35 which is located on only the side opposite to the picture-element array 1 on the solid-state imaging-device chip 10.

In this embodiment, since the groove-like recess 38 in the chip carrier 31c is open at the opposite short sides, an in-line arrangement type of solid state imaging device such as that shown in FIG. 4 can be obtained by arranging the chip carriers 31c in such a manner that the short-side end of each chip carrier 31c abuts against the short-side end of the adjacent chip carrier 31c.

FIG. 11A shows a chip carrier 31d for use in a fifth embodiment of the present invention. This chip carrier 31d differs from the chip carrier 31c of FIG. 10A in that the projecting portion 35 extends to cover the opposite short-side ends of the groove-like recess 38. As shown in FIG. 11B, the solid-state imaging-device chip 10 is carried on the chip carrying area 36 in the groove-like recess 38, and the bonding pads 12 of the solid-state imaging-device chip 10 are electrically connected to the corresponding terminals 32 of the chip carrier 31d by the wires 13, thus forming the imaging unit 30d.

This imaging unit 30d enables an staggered arrangement such as that shown in FIG. 8. If an in-line arrangement is not needed, if the short-side ends of the solid-state imaging-device chip 10 are covered by the projecting portion 35 of the chip carrier 31d as in this embodiment, the edges of the solid-state imaging-device chip 10 are reliably prevented from being physically damaged. Moreover, since the holding area of the chip carrier 31d is enlarged, the reliability of handling of chips can be further improved.

Figure 12A:
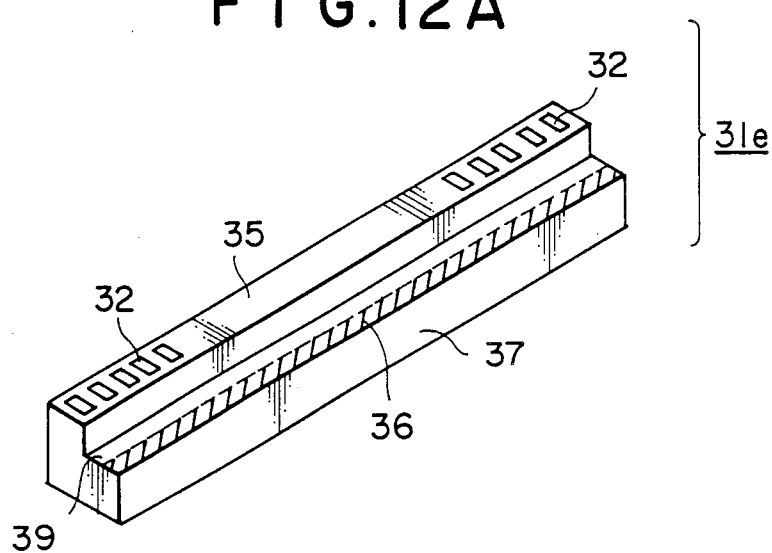
FIG. 12A is a diagrammatic perspective view showing the chip carrier used in a sixth embodiment.
Figure 12B:
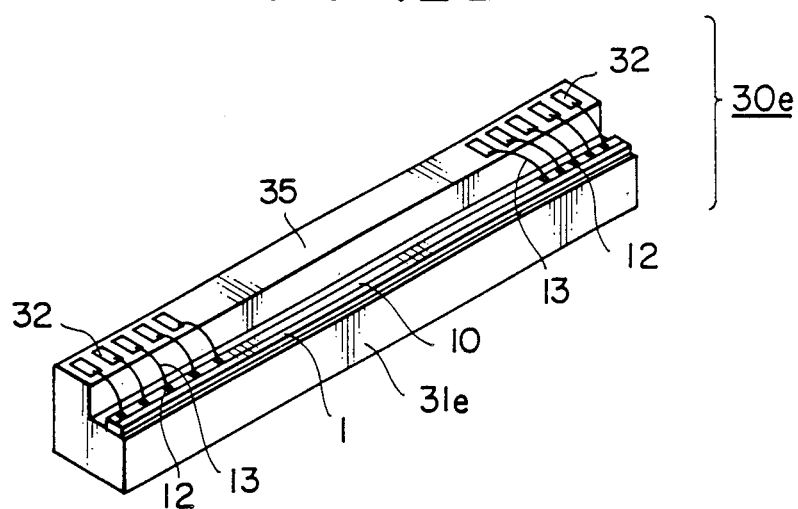
FIG. 12B is a diagrammatic perspective view showing an imaging unit employing the chip carrier of FIG. 12A.

FIG. 12A is a schematic perspective view of a chip carrier 31e for use in a sixth embodiment of this invention. A single stepped portion 39 extends across the length of the chip carrier 31e, and the chip mounting area 36 is provided on this stepped portion 39. In other words, the chip carrier 31e has a structure in which the projecting portion 35 on the same side as the cutouts 37 is removed from the chip carrier 31c shown in FIG. 10A. As shown in FIG. 12B, the solid-state imaging-device chip 10 is mounted on the chip carrying area 36 on this chip carrier 31e, and the bonding pads 12 on the solid-state imaging-device chip 10 are electrically connected to the corresponding terminals 32 on the chip carrier 31e by the wires 13. In this manner, an imaging unit 30e is formed.

Although this embodiment utilizes the chip carrier 31e having a simple structure, it is possible to protect the solid-state imaging-device chip 10 to a satisfactory extent. As in the embodiment shown in FIG. 11B, the opposite short-side ends of the solid-state imaging-device chip 10 may be covered by the projecting portion 35.

Figure 13A:
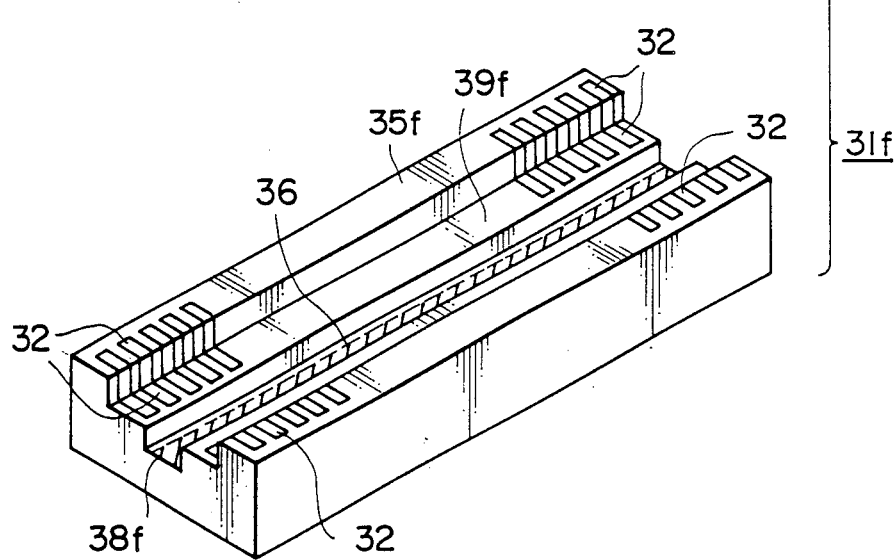
FIG. 13A is a diagrammatic perspective view showing the chip carrier used in a seventh embodiment.
Figure 13B:
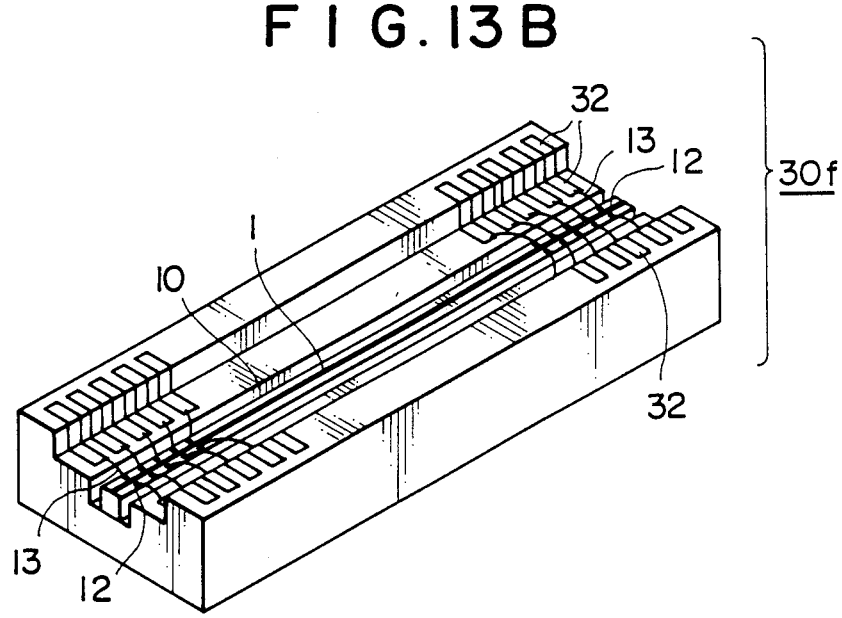
FIG. 13B is a diagrammatic perspective view showing an imaging unit employing the chip carrier of FIG. 13A.

FIG. 13A is a perspective view of a chip carrier 31f for use in a seventh embodiment of this invention. This chip carrier 31f has a stair step structure in which a portion 39f is formed between a groove-like recess 38f and each projecting portion 35f positioned on the opposite sides of the groove-like recess 38f, the stepped portions 39f being lower than the projecting portions 35f. The chip mounting area 36 is provided at the bottom of the groove-like recess 38f, and each of the terminals 32 is formed to extend continuously from the top of the corresponding projecting portion 35f to the upper surface of the adjacent stepped portion 39f. As shown in FIG. 13B, the solid-state imaging-device chip 10 is mounted on the chip carrying area 36 in the chip carrier 31f, and the bonding pads 12 of the solid-state imaging-device chip 10 and the corresponding terminals 32 on the stepped portion 39f are electrically connected to each other by the wires 13, thereby forming the imaging unit 30f.

Since the imaging unit 30f has the above-described structure, the wires 13 are bonded at the stepped portions 39f lower than the projecting portions 35f. Accordingly, even if the imaging unit 30f falls during handling, damage to solid-state imaging-device chip 10 as to well as the wires 13 is prevented. After the imaging unit 30f has been mounted on the package board, wire bonding is formed between the terminals 32 formed on each of the projecting portions 35 and the respective terminals on the package board.

Figure 14A:
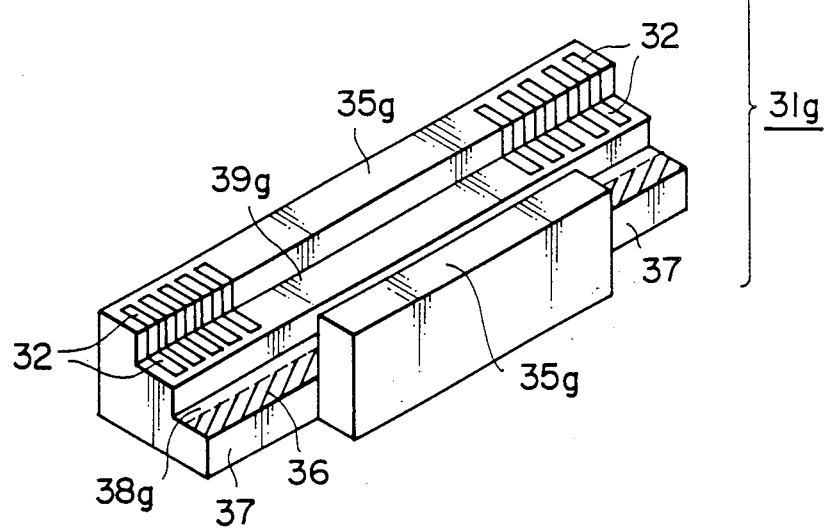
FIG. 14A is a diagrammatic perspective view showing the chip carrier used in an eighth embodiment.
Figure 14B:
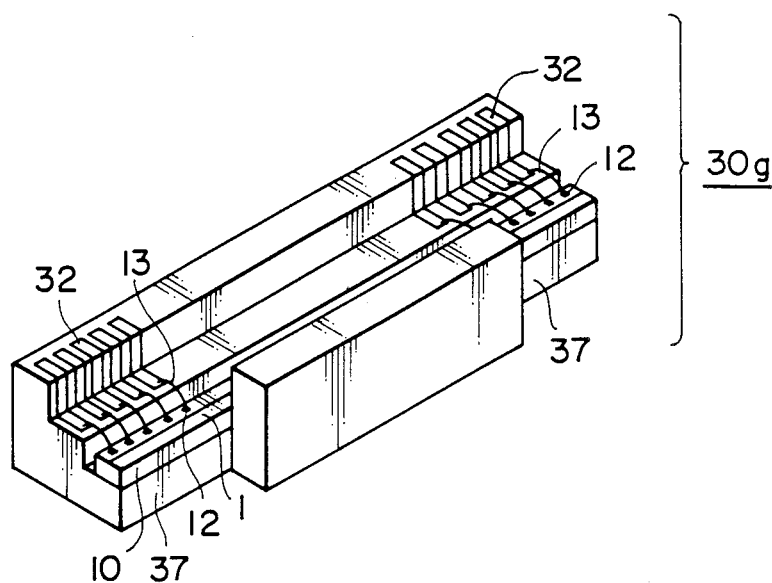
FIG. 14B is a diagrammatic perspective view showing an imaging unit employing the chip carrier of FIG. 14A.

FIG. 14A is a perspective view of a chip carrier 31g for use in an eighth embodiment of this invention. In this chip carrier 31g, a stepped portion 39g and a projecting portion 35g are formed along one side of a groove-like recess 38g as in the case of the seventh embodiment, while, along the other side, another projecting portion 35g and the cutouts 37 are formed. Accordingly, as shown in FIG. 14B, the solid-state imaging-device chip 10 is mounted on the chip mounting area 36 in the groove-like recess 38g, and the terminals 32 positioned on the stepped portion 39g are electrically connected to the corresponding bonding pads 12 on the solid-state imaging-device chip 10 by the wires 13. In this manner, an imaging unit 30g suitable for use in a staggered arrangement is formed.

Figure 15A:
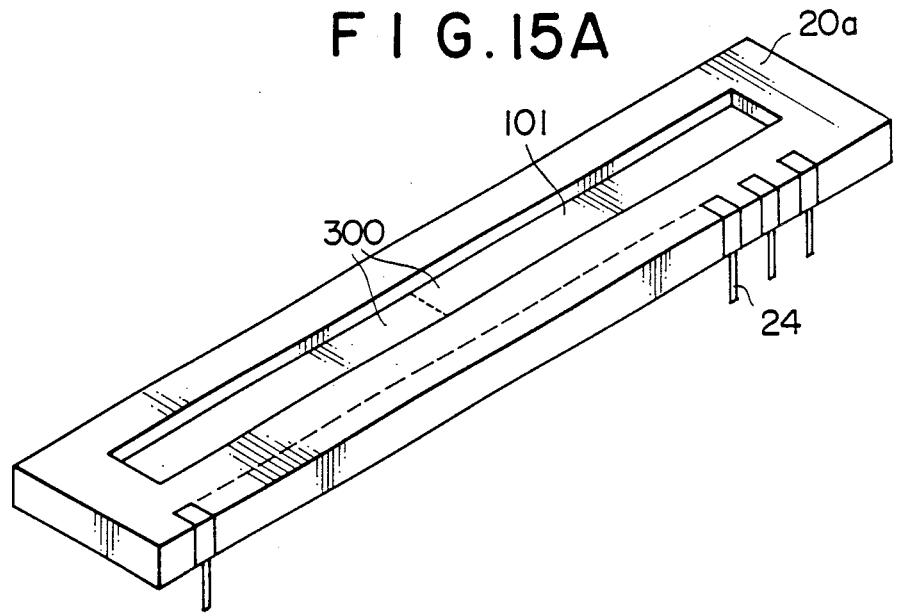
FIG. 15A is a diagrammatic perspective view showing the package board used in a ninth embodiment.
Figure 15B:
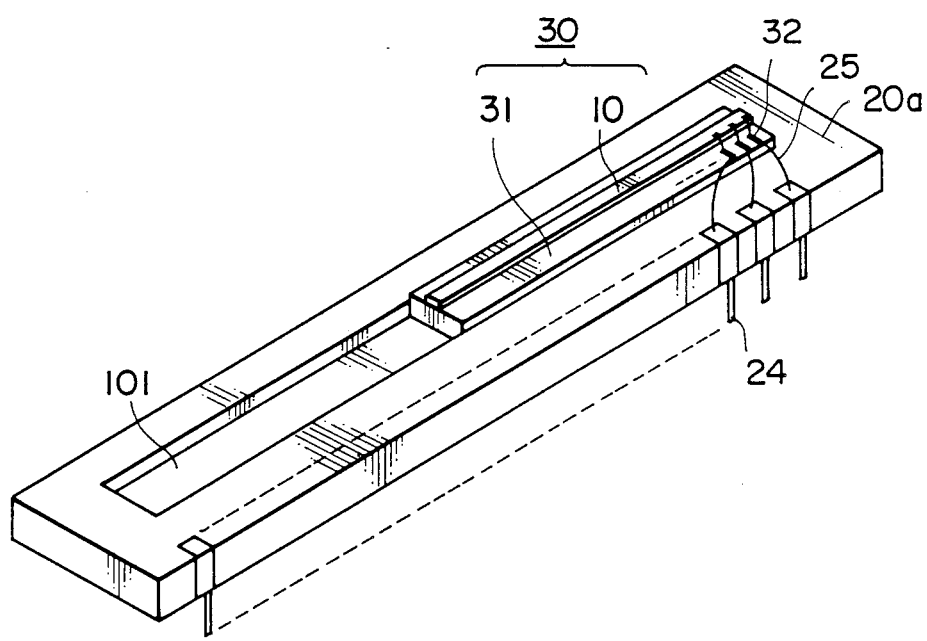
FIG. 15B is a diagrammatic perspective view showing an imaging unit which is carried on the package board of FIG. 15A.

FIG. 15A is a perspective view of a package board 20a for use in a ninth embodiment of this invention. A recess 101 is formed in the upper portion (as viewed in the figure) of the package board 20a, and an imaging-unit carrying area 300 is defined in the recess 101. The imaging unit 30 can be easily positioned merely by fitting and securing the chip carrier 31 of the imaging unit 30 in the recess 101 as shown in FIG. 15B. In this manner, the imaging unit 30 is mounted on the package board 20a and the terminals 32 of the imaging unit 30 are wire-bonded to the corresponding external leads 24 of the package board 20a by the wires 25. Incidentally, the illustrated package board 20a is of a type which accommodates two imaging units 30, and FIG. 15B shows a state wherein one of the two imaging units 30 is mounted.

Figure 16A:
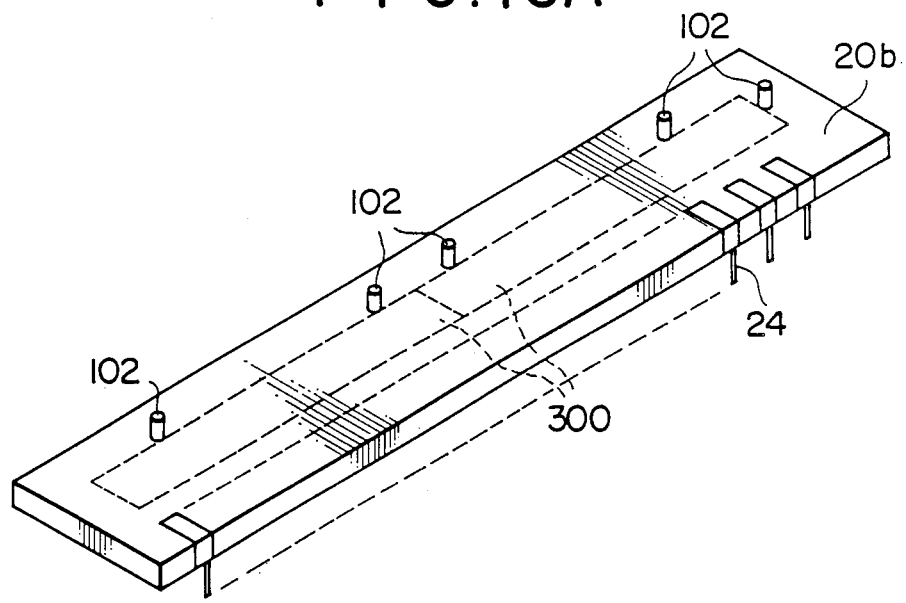
FIG. 16A is a diagrammatic perspective view showing the package board used in a tenth embodiment.
Figure 16B:
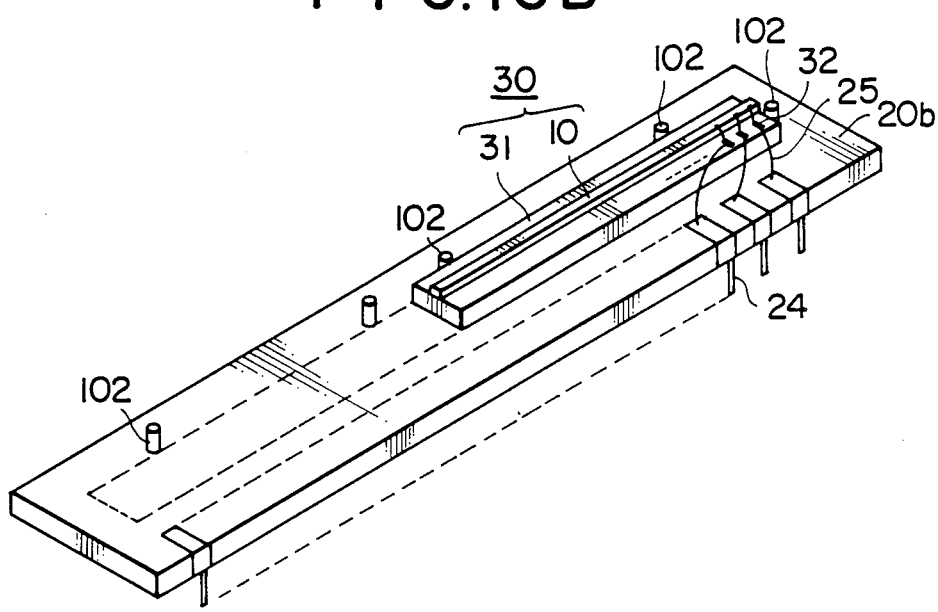
FIG. 16B is a diagrammatic perspective view showing an imaging unit which is carried on the package board of FIG. 16A.

FIG. 16A is a perspective view of a package board 20b for use in a tenth embodiment of this invention. On the upper surface (as viewed in the figure) of this package board 20b, a plurality of positioning pins 102 are fixed at predetermined locations. The imaging-unit carrying area 300 is defined by these pins 102. The imaging unit 30 can be easily positioned by securing the imaging unit 30 on the package board 20b while pressing the chip carrier 31 against the pins 102 as shown in FIG. 16B. After the imaging unit 30 has been mounted on the package board 20b, the terminals 32 of the imaging unit 30 are wire-bonded to the corresponding external leads 24 of the package board 20b by the wires 25. Incidentally, the illustrated package board 20b is of a type which accommodates two imaging units 30, and FIG. 16B shows a state wherein only one of the two imaging units 30 is carried mounted.

Figure 17A:
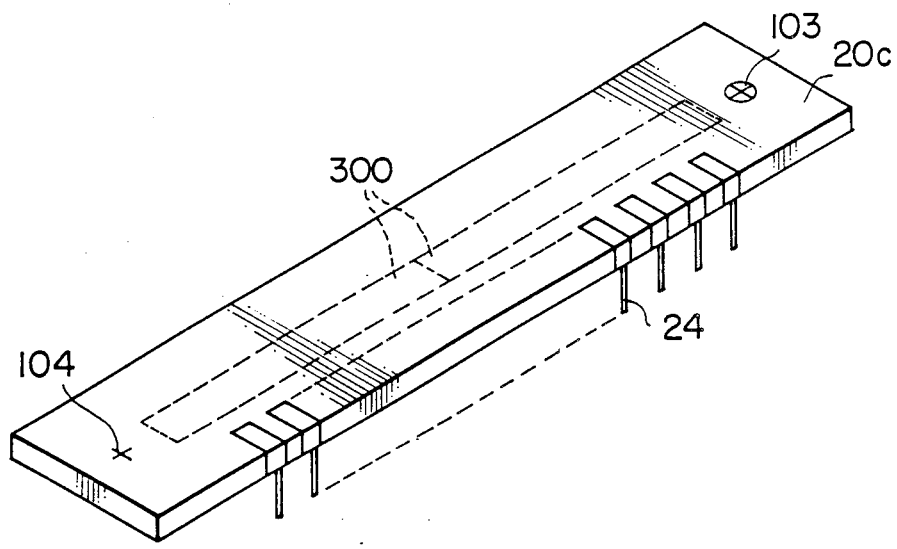
FIG. 17A is a diagrammatic perspective view showing the package board used in an eleventh embodiment.
Figure 17B:
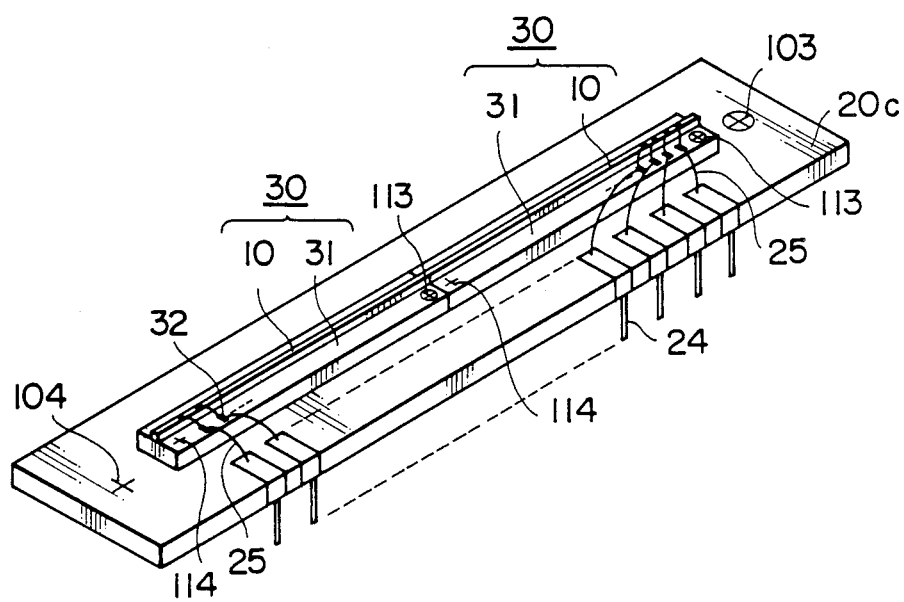
FIG. 17B is a diagrammatic perspective view showing an imaging unit which is carried on the package board of FIG. 17A.

FIG. 17A is a perspective view of a package board 20c for use in an eleventh embodiment of this invention. On the upper surface (as viewed in the figure) of the package board 20c, alignment marks 103 and 104 are formed at predetermined locations, and the imaging-unit carrying mounting area 300 is defined in the vicinity of these alignment marks 103 and 104. Moreover, as shown in FIG. 17B, alignment marks 113 and 114 are provided on the chip carrier 31 of the imaging unit 30 as well. Positioning of the imaging unit 30 is performed while confirming the respective relative positions between the alignment marks 103 and 104 on the package board 20c and the alignment marks 113 and 114 on the chip carrier 31 by means of an optical detecting means (not shown). After the imaging unit 30 has been mounted on the package board 20c in this manner, the terminals 32 of the imaging unit 30 are wire-bonded to the corresponding external leads 24 of the package board 20c by the wires 25.

Figure 18A:
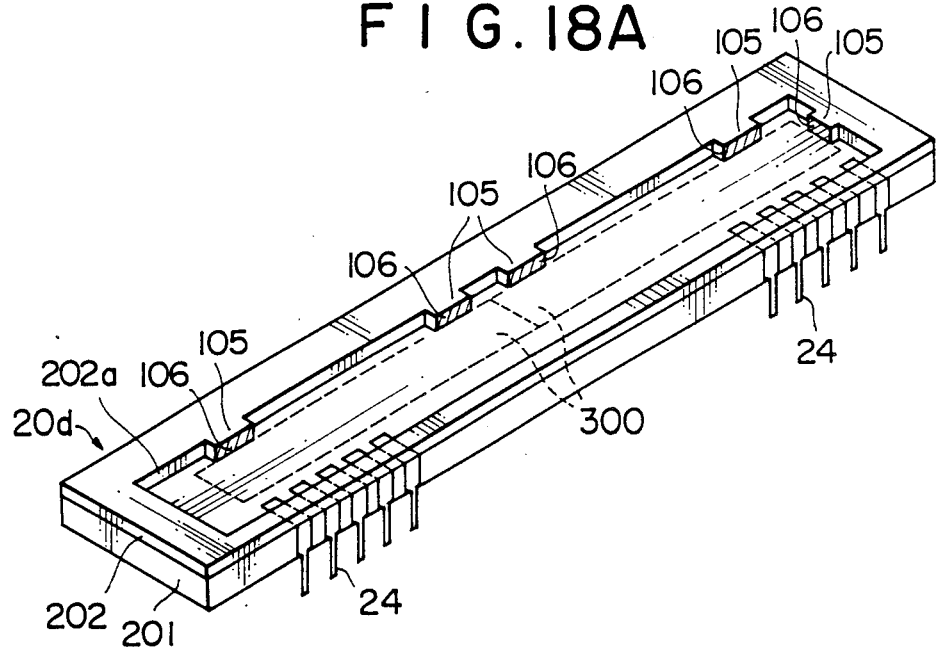
FIG. 18A is a diagrammatic perspective view showing the package board used in a twelfth embodiment.

FIG. 18A is a perspective view of a package board 20d for use in a twelfth embodiment of this invention.

Figure 18B:
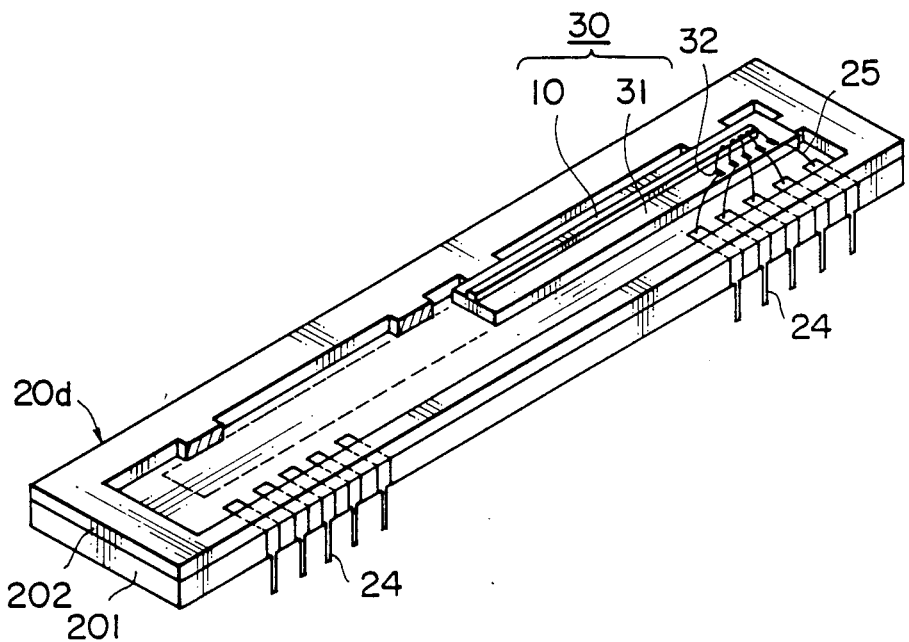
FIG. 18B is a diagrammatic perspective view showing an imaging unit which is carried on the package board of FIG. 18A.
Figure 20:
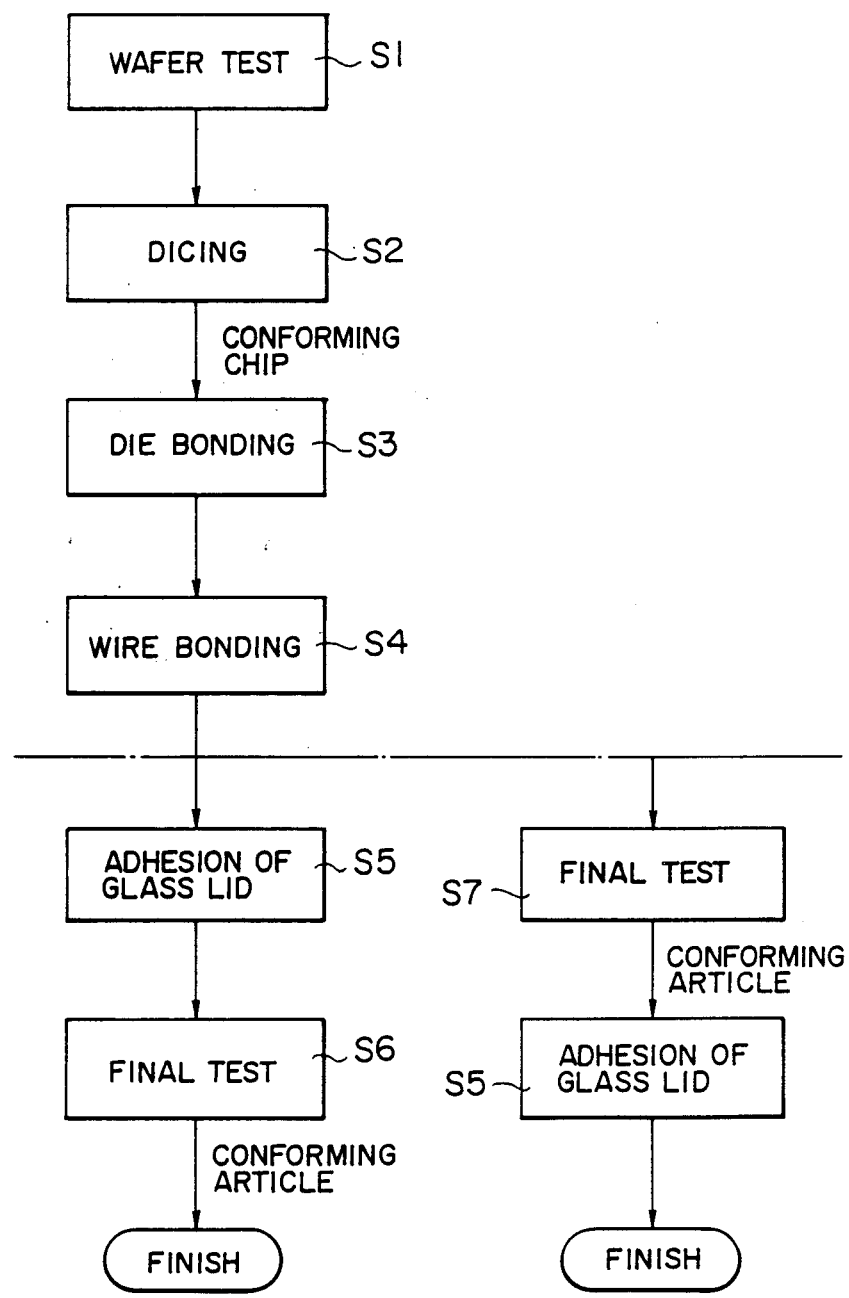
FIG. 20 is a flow chart showing the conventional process steps of producing a solid state imaging device.
Figure 21A:
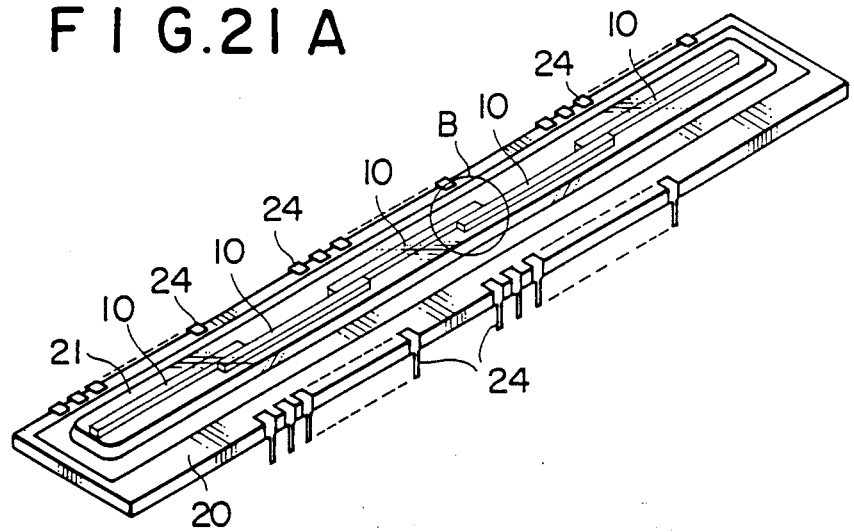
FIGS. 21A and 21B are a perspective view and a cross-sectional view which respectively show another conventional type of solid state imaging device.
Figure 21B:
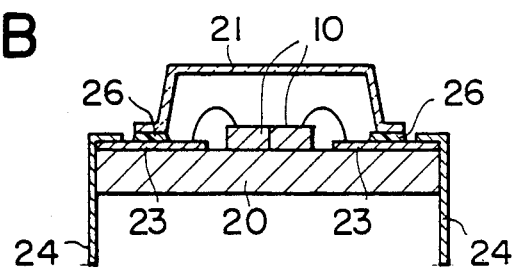
Figure 21C:
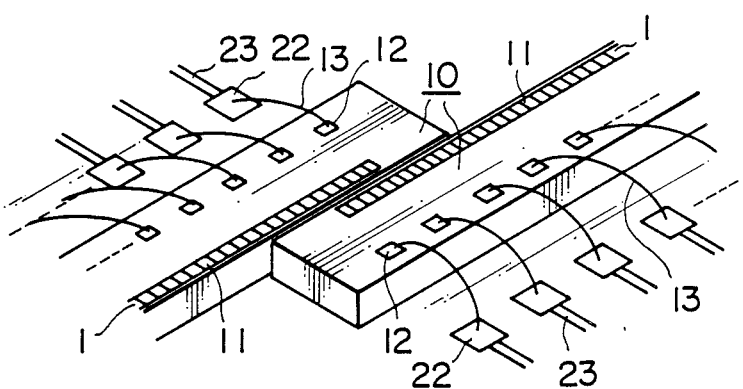
FIG. 21C is an enlarged view of a portion B of FIG. 21A.

This package board 20d has a base board 201 of a flat form and a spacer 202 which is secured to one surface of the base board 201. The external leads 24 are provided on the base board 201. An aperture 202a for accommodating the imaging units 30 is formed in the middle portion of the spacer 202, and a plurality of positioning projections 105 are formed at predetermined locations projecting into the aperture 202a. Each of the projections 105 has an end face 106 which is prepared with high precision. The imaging unit 30 can be easily positioned by securing the imaging unit 30 on the base board 201 while pressing one side of the chip carrier 31 of the imaging unit 30 against the end faces 106 of the projections 105 as shown in FIG. 18B. In this embodiment, it is not necessary to prepare entire end face of the aperture 202a in the spacer 202 with high precision, and only the end face 106 of each projection 105 has only to be worked with high precision. Accordingly, production of the package board 20d can be facilitated. After the required imaging units 30 have been mounted on the package board 20b, the terminals 32 of the imaging units 30 are wire-bonded to the corresponding external leads 24 of the package board 20b by the wires 25.

In each of the embodiments described above, an elongated form of chip such as a CCD linear image sensor is illustrated as the solid-state imaging-device chip 10. However, a so-called area image sensor, that is, a square sensor in which the ratio of the short side to the long side is not large may also be employed, and the form of a sensor chip is not limited to a specific external configuration.

In each of the embodiments described above, an in-line arrangement and a staggered arrangement are illustrated as particular examples of the arrangements of the solid-state imaging-device chip 10. However, in accordance with the gist of the present invention, the arrangement of the solid-state imaging-device chip 10 is not limited to either of these arrangements. The present invention can of course be applied to, for example, an array-like arrangement in which picture-element arrays are arranged in a mesh-like form, a horizontal arrangement in which a plurality of picture-element arrays are arranged parallel with one another, or various other arrangements.

In each of the above-described embodiments of the solid state imaging device, a 5-chip arrangement or a 2-chip arrangement is illustrated as a particular example of either the in-line arrangement or the staggered arrangement. However, the number of chips is not limited to these numbers alone.

The solid-state imaging-device chip 10 may be of a type which is intended for a black-and-white image, or it may be of a type in which an on-chip color filter is formed on a surface for the purpose of a color image. In addition, it is also possible to employ a chip of a type which has sensitivity with respect to a band of visible wavelengths or of another type which is sensitive to infrared or ultraviolet light.

What is claimed is:

1. A solid state imaging device comprising:
   a plurality of solid state imaging device chips, each chip having a picture element array and a plurality of bonding pads;
   a plurality of chip carriers on which corresponding solid state imaging device chips are mounted, each chip carrier having a substantially rectangular shape from which at least one corner has been removed to form a cutout, and a plurality of terminals electrically connected to respective bonding pads on the solid state imaging device chip mounted thereon;
   a package board on which said plurality of chip carriers are mounted, a cutout of one chip carrier receiving a corner of an adjacent chip carrier; and
   external leads disposed on said package board and electrically connected to corresponding terminals of said plurality of chip carriers.

2. A solid state imaging device according to claim 1 wherein each of said chip carriers has a pair of projecting portions and a groove-like recess positioned between said pair of projecting portions, said solid state imaging device chips being mounted in said groove-like recess.

3. A solid state imaging device according to claim 1, wherein said plurality of terminals of one of said chip carriers are mounted on oneof said pairof projecting portions.

4. A solid state imaging device according to claim 1, wherein said groove-like recess is open at opposite ends thereof.

5. A solid state imaging device according to claim 1 wherein said groove-like recess has a depth greater than the height of said solid-state imaging chip.

6. A solid state imaging device according to claim 1 wherein said groove-like recess is closed at opposite ends thereof.

7. A solid state imaging device comprising:
   a plurality of solid state imaging device chips, each chip having a picture element array and a plurality of bonding pads;
   a plurality of chip carriers on which corresponding solid state imaging device chips are mounted, each chip carrier comprising a pair of projecting portions, a pair of stepped portions positioned between said projecting portions and deeper than said projecting portions, a groove-like recess positioned between said stepped portions, said corresponding solid state imaging device chip being mounted in said groove-like recess, and a plurality of terminals electrically connected to respective bonding pads on the solid state imaging device chip mounted thereon;
   a package board on which said plurality of chip carriers are mounted; and
   external leads disposed on said package board and electrically connected to corresponding terminals of said plurality of chip carriers.

8. A solid state imaging device according to claim 7, wherein said plurality of terminals of each of said chip carriers extends from each of said stepped portions to the projecting portion contiguous thereto.

9. A solid state imaging device comprising;
a plurality of solid state imaging device chips, each chip having a picture element array and a plurality of bonding pads;
a plurality of chip carriers on which corresponding solid state imaging device chips are mounted, each chip carrier comprising a first projecting portion and a second projecting portion, a stepped portion positioned between said first and second projecting portions and connected to said first projecting portions, and a groove-like recess positioned between said second projecting portion and said stepped portion, said corresponding solid state imaging device chip being mounted in said groove-like recess, and a plurality of terminals electrically connected to respective bonding pads, on the solid state imaging device chip mounted thereon, each carrier chip including a cutout defined at at least one of the ends of said first and second projecting portions;
a package board on which said plurality of chip carriers are mounted, a cutout of one chip carrier receiving a corner of an adjacent chip carrier; and
external leads disposed on said package board and electrically connected to corresponding terminals of said plurality of chip carriers.

10. A solid state imaging device according to claim 7 including a cutout defined at at least one of the opposite ends of said pair of projecting portions, said cutout being engaged with an adjacent chip carrier in said device.

11. A solid state imaging device comprising:
a plurality of solid state imaging device chips, each chip having a picture array and a plurality of bonding pads;
a plurality of chip carriers on which corresponding solid state imaging device chips are mounted and a plurality of terminals electrically connected to respective bonding pads on the solid state imaging chip mounted thereon;
a package board on which said plurality of chip carriers are mounted, said package board including a recess defining an opening in which said plurality of chip carriers are mounted and a plurality of projections projecting onto said opening for holding said plurality of chip carriers in position; and
external leads disposed on said package board and electrically connected to corresponding terminals of said plurality of chip carriers.

12. A solid state imaging device comprising:
a plurality of solid state imaging device chips, each chip having a picture element array and a plurality of bonding pads;
a plurality of chip carriers on which corresponding solid state imaging device chips are mounted and a plurality of terminals electrically connected to respective bonding pads on the solid state imaging device chip mounted thereon;
a package board on which said plurality of chip carriers are mounted;
a plurality of pins disposed on said package board positioning said plurality of chip carriers on said package board; and
external leads disposed on said package board and electrically connected to corresponding terminals of said plurality of chip carriers.

13. A solid state imaging device comprising:
a plurality of solid state imaging device chips, each chip having a picture element array and a plurality of bonding pads;
a plurality of chip carriers on which corresponding solid state imaging device chips are mounted and a plurality of terminals electrically connected to regularly bonding pads on the solid state imaging device chip mounted thereon;
a package board on which said plurality of chip carriers are mounted;
alignment marks disposed on said package board and each of said chip carriers for positioning said chip carriers on said package board; and
external leads disposed on said package board and electrically connected to corresponding terminals of said plurality of chip carriers.

14. A solid state imaging device comprising:
a plurality of solid state imaging device chips, each chip having a picture element array and a plurality of bonding pads;
a plurality of chip carriers on which corresponding solid state imaging device chips are mounted and a plurality of terminals electrically connected to respective bonding pads on the solid state imaging device chip mounted thereon;
a package board on which said plurality of chip carriers are mounted, said package board including a generally planar baseboard and a spacer secured to said baseboard, said spacer having an aperture for accomodating said plurality of chip carriers and a plurality of projections projecting into said aperture for holding said plurality of chip carriers in position; and
external leads disposed on said package board and electrically connected to corresponding terminals of said plurality of chip carriers.

15. A solid state imaging according to claim 1 wherein said solid state imaging device chip is a CCD linear image sensor.

16. A solid state imaging device according to claim 2 wherein said plurality of solid state imaging device chips are arranged with the picture element arrays positioned in a straight line.

17. A solid state imaging device according to claim 1 wherein said plurality of solid state imaging device chips are arranged with the picture elements disposed in alternatingly positions, respectively.

18. A solid state imaging device according to claim 1 including a glass lid secured to said package board for projecting said plurality of solid state imaging device chips.

19. A solid state imaging device comprising:
a plurality of solid state imaging device chips, each chip having a picture element array and a plurality of bonding pads;
a plurality of chip carriers on which corresponding solid state imaging device chips are mounted, each chip carrier comprising a pair of projecting portions, a groove-like recess positioned between said pair of projecting portions and open at opposite ends, said corresponding solid state imaging device chip being mounted in said groove-like recess, and a plurality of terminals electrically connected to respective bonding pads on said solid state imaging device chip mounted thereon;

a package board on which said plurality of chip carriers are mounted; and external leads disposed on said package board and electrically connected to corresponding terminals of said plurality of chip carriers.

20. A solid state imaging device comprising:

a plurality of solid state imaging device chips, each chip having a picture element array and a plurality of bonding pads;

a plurality of chip carriers on which corresponding solid state imaging device chips are mounted and a plurality of terminals electrically connected to respective bonding pads on the solid state imaging device chip mounted thereon;

a package board on which said plurality of chip carriers are mounted, said package board including a recess in which said plurality of chip carriers are mounted; and external leads disposed on said package board and electrically connected to corresponding terminals of said plurality of chip carriers.

* * * * *

UNITED STATES PATENT AND TRADEMARK OFFICE
CERTIFICATE OF CORRECTION

PATENT NO. : 4,987,477

DATED : January 22, 1991

INVENTOR(S) : Masahiko Ikeno

It is certified that error appears in the above-identified patent and that said Letters Patent is hereby corrected as shown below:

```
Column 16, line 36, change "one" to --each--;
    "   16, line 37, change "oneof" to --one of--;
    "   16, line 37, change "pairof" to --pair of --;
    "   16, line 44, after "imaging-" insert --device--.
Column 17, line 39, after "picture" insert --element--;
    "   17, line 50, change "onto" to --into--.
Column 18, line 11, change "regularly" to  --respective--;
    "   18, line 52, after "alternatingly" insert --offset--;
```

Signed and Sealed this

First Day of September, 1992

Attest:

DOUGLAS B. COMER

Attesting Officer

Acting Commissioner of Patents and Trademarks